(12) United States Patent
Kakiuchi et al.

(10) Patent No.: US 8,921,142 B2
(45) Date of Patent: Dec. 30, 2014

(54) METHOD AND APPARATUS FOR MANUFACTURING ORGANIC EL DEVICE

(71) Applicant: Nitto Denko Corporation, Ibaraki-shi, Osaka (JP)

(72) Inventors: Ryohei Kakiuchi, Ibaraki (JP); Satoru Yamamoto, Ibaraki (JP); Kanako Hida, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 0 days.

(21) Appl. No.: 14/235,353

(22) PCT Filed: Oct. 17, 2012

(86) PCT No.: PCT/JP2012/076848
§ 371 (c)(1),
(2), (4) Date: Jan. 27, 2014

(87) PCT Pub. No.: WO2013/061845
PCT Pub. Date: May 2, 2013

(65) Prior Publication Data
US 2014/0186985 A1 Jul. 3, 2014

(30) Foreign Application Priority Data

Oct. 24, 2011 (JP) .................. 2011-233066
Nov. 9, 2011 (JP) .................. 2011-245836
Feb. 2, 2012 (JP) .................. 2012-020884
Feb. 2, 2012 (JP) .................. 2012-020887
May 17, 2012 (JP) .................. 2012-113290

(51) Int. Cl.
*H01L 21/00* (2006.01)
*H01L 51/56* (2006.01)
*C23C 14/12* (2006.01)
*C23C 14/56* (2006.01)
*H01L 51/00* (2006.01)

(52) U.S. Cl.
CPC ............. *H01L 51/56* (2013.01); *C23C 14/12* (2013.01); *C23C 14/562* (2013.01); *H01L 51/0008* (2013.01)
USPC .................. 438/46; 438/22; 438/34; 118/726

(58) Field of Classification Search
USPC ........................................... 438/46
See application file for complete search history.

(56) References Cited

U.S. PATENT DOCUMENTS

| 6,911,671 | B2* | 6/2005 | Marcus et al. | 257/79 |
| 8,628,620 | B2* | 1/2014 | Kawato et al. | 118/720 |
| 2012/0048197 | A1* | 3/2012 | Mochizuki et al. | 118/723 R |

FOREIGN PATENT DOCUMENTS

| JP | 2006-249471 A | 9/2006 |
| JP | 2008-287996 A | 11/2008 |
| WO | 2010/090504 A2 | 8/2010 |

OTHER PUBLICATIONS

Notification of Transmittal of Translation of the International Preliminary Report on Patentability (Form PCT/IB/338) of International Application No. PCT/JP2012/076848, mailing date of May 8, 2014, with Forms PCT/IB/373, PCT/ISA/237, and PCT/IB/326.
International Search Report dated Jan. 8, 2013 issued in corresponding application No. PCT/JP2012/076848.

* cited by examiner

*Primary Examiner* — Angel Roman
(74) *Attorney, Agent, or Firm* — Westerman, Hattori, Daniels & Adrian, LLP

(57) ABSTRACT

Provided is a method and an apparatus for manufacturing an organic EL device which make it possible to manufacture organic EL devices capable of suppressing quality degradation. The method for manufacturing an organic EL device, in which constituent layers of an organic EL element are formed over a substrate in the form of a strip by deposition, while the substrate is being moved in the longitudinal direction, includes: a constituent layer-forming step of performing deposition over one surface of the substrate, while the substrate is being moved in the longitudinal direction, sequentially in an upward deposition unit and a lateral deposition unit provided along the moving direction of the substrate by discharging a vaporized material from an evaporation source. The constituent layer-forming step includes an upward deposition step, a laterally deposition step, and a direction changing step.

8 Claims, 23 Drawing Sheets

F I G. 3
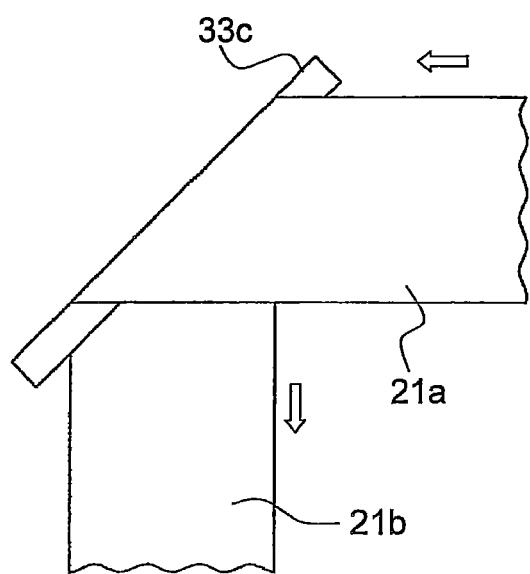

F I G . 4
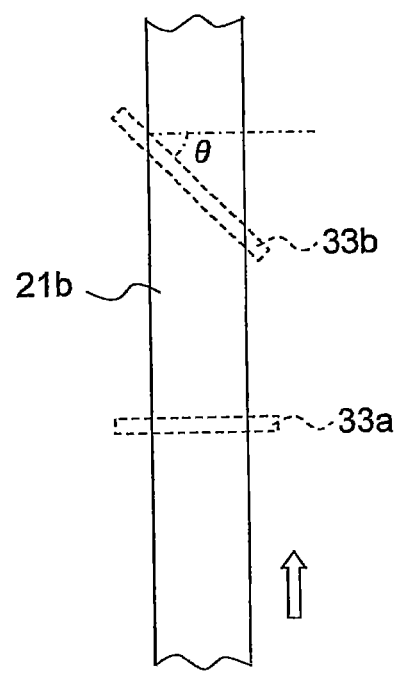

F I G. 9
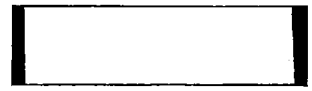 
EXAMPLE　　COMPARATIVE EXAMPLE

METHOD AND APPARATUS FOR MANUFACTURING ORGANIC EL DEVICE

CROSS-REFERENCE TO RELATED APPLICATIONS

This application claims priority to Japanese Patent Application Nos. 2011-233066, 2011-245836, 2012-020884, 2012-113290, and 2012-020887, the disclosures of which are incorporated herein by reference in their entirety.

FIELD

The present invention relates to a method and an apparatus for manufacturing an organic EL device.

BACKGROUND

Recently, attention has been given to organic EL (electroluminescence) devices, as devices for use as next-generation light emitting displays with low consumption power. An organic EL device is basically composed of a substrate, and an organic EL element having an organic EL layer and a pair of electrode layers provided thereon. The organic EL layer is composed of at least one layer including a light emitting layer formed of an organic light emitting material. Such an organic EL device emits multicolor light derived from the organic light emitting material. Further, the organic EL device is a self-luminous device. Therefore, attention has been focused thereon for use as a display such as television (TV).

The organic EL device is, more specifically, configured to be formed by stacking an anode layer, an organic EL layer, and a cathode layer, in this order over the substrate as constituent layers of an organic EL element.

In methods for manufacturing such an organic EL device, vacuum deposition and coating are commonly known as a technique for forming constituent layers of the organic EL element (which may be hereinafter referred to simply as constituent layers) over the substrate. Among these, vacuum deposition is mainly used, particularly because of the capability of increasing the purity of the materials for forming constituent layers and the ease of achieving long life span.

In the above-mentioned vacuum deposition, each constituent layer is formed by performing deposition using an evaporation source provided in a vacuum chamber at a position facing the substrate. Specifically, a material for forming the constituent layer is heated by a heating unit provided in the evaporation source so as to be vaporized. The vaporized material for forming the constituent layer (vaporized material) is discharged from the evaporation source. The constituent layer-forming material is deposited over the substrate, thereby forming the constituent layer.

In such vacuum deposition, a roll process is employed from the viewpoint of cost reduction. The roll process is a process in which: a substrate in the form of a strip wound into a roll is continuously unwound; constituent layers are continuously deposited over the substrate while the unwound substrate is being moved; and the substrate on which the constituent layers have been deposited is wound up into a roll (see Patent Literature 1).

CITATION LIST

Patent Literature

Patent Literature 1: JP 2008-287996 A

SUMMARY

Technical Problem

However, in the above-mentioned roll process, when the constituent layer is formed by arranging the evaporation source above the substrate and discharging the vaporized material downwardly from the evaporation source toward the substrate, there may be cases where foreign matter such as dust is dropped from the evaporation source and adheres to the substrate, so as to be incorporated into the organic EL element. Such incorporation of foreign matter into the organic EL element causes adverse effects on light emission of the organic EL element.

Therefore, in order to suppress the incorporation of foreign matter, it is conceivable to form the constituent layer by arranging the evaporation source below the substrate and discharging the above-mentioned vaporized material upwardly from the evaporation source toward the substrate.

However, if all constituent layers are attempted to be formed by sequential deposition from below, it is necessary to sequentially align the evaporation sources below the substrate and move the substrate so as to pass above all the evaporation sources, since the organic EL device is formed by stacking a plurality of constituent layers as mentioned above.

In this case, the region of the substrate that passes above the evaporation sources at a time is required to be long, which makes it difficult to give sufficient tension to the substrate. As a result, the substrate easily warps or vibrates. Then, the contact between the deposition surface of the substrate and each evaporation source due to the warpage or vibration of the substrate may possibly cause damage on the substrate or the constituent layers formed over the substrate. Further, variation in the distance between the substrate and each evaporation source makes it difficult to appropriately control the thickness of each constituent layer, which may result in failure to obtain constituent layers with desired emission properties.

On the other hand, in the case where roller members and the like are used to support the substrate from below, in order to prevent the warpage or vibration of the substrate, the contact between the deposition surface of the substrate and each roller member may possibly cause damage on the formed constituent layers.

In this way, light emission failure due to the incorporation of foreign matter or the difficulty in thickness control, or damage on the deposition surface of the substrate due to the contact with the evaporation sources, the roller members, etc., causes degradation in quality of the organic EL device.

In view of the above-mentioned problems, it is an object of the present invention to provide a method and an apparatus for manufacturing an organic EL device which make it possible to manufacture organic EL devices capable of suppressing quality degradation.

Solution to Problem

According to the present invention, there is provided a method for manufacturing an organic EL device, in which constituent layers of an organic EL element are formed over a substrate in the form of a strip by deposition, while the substrate is being moved in the longitudinal direction, the method including: a constituent layer-forming step of performing deposition over one surface of the substrate, while the substrate is being moved in the longitudinal direction, sequentially in at least an upward deposition unit and a lateral deposition unit arranged along the moving direction of the substrate by discharging a vaporized material from an evaporation source. The constituent layer-forming step includes: an upward deposition step of performing deposition over a deposition surface of the substrate, while the substrate is being moved with its deposition surface facing downward, in the upward deposition unit by discharging the vaporized material from the evaporation source arranged below the substrate toward the deposition surface; a lateral deposition step of performing deposition over a deposition surface of the substrate, while the substrate is being moved with its deposition surface facing laterally, in the lateral deposition unit by discharging the vaporized material from the evaporation source arranged laterally of the substrate toward the deposition surface; and a direction changing step of turning the substrate conveyed from the upward deposition unit so as to change the facing direction of the deposition surface from downward to lateral, by means of a guide mechanism provided between the upward deposition unit and the lateral deposition unit, while supporting the substrate from the non-deposition surface side so that the non-deposition surface of the substrate faces the inside of the turn, so as to guide the substrate to the lateral deposition unit.

Further, according to the present invention, there is also provided a method for manufacturing an organic EL device, in which constituent layers of an organic EL element are formed over a substrate in the form of a strip by deposition, while the substrate is being moved in the longitudinal direction, the method including: a constituent layer-forming step of performing deposition over one surface of the substrate, while the substrate is being moved in the longitudinal direction, sequentially in at least a lateral deposition unit and an upward deposition unit arranged along the moving direction of the substrate by discharging a vaporized material from an evaporation source. The constituent layer-forming step includes: a lateral deposition step of performing deposition over a deposition surface of the substrate, while the substrate is being moved with its deposition surface facing laterally, in the lateral deposition unit by discharging the vaporized material from the evaporation source arranged laterally of the substrate toward the deposition surface; an upward deposition step of performing deposition over a deposition surface of the substrate, while the substrate is being moved with its deposition surface facing downward, in the upward deposition unit by discharging the vaporized material from the evaporation source arranged below the substrate toward the deposition surface; and a direction changing step of turning the substrate conveyed from the lateral deposition unit so as to change the facing direction of the deposition surface from lateral to downward, using a guide mechanism provided between the lateral deposition unit and the upward deposition unit, while supporting the substrate from the non-deposition surface side so that the non-deposition surface of the substrate faces the inside of the turn, so as to guide the substrate to the upward deposition unit.

In the above-mentioned manufacturing method, it is preferable that the guide mechanism have a plurality of roller members supporting the non-deposition surface, and at least one of the roller members be arranged along a direction inclined to a width direction of the substrate.

In the above-mentioned manufacturing method, the at least one of the roller members is preferably arranged along a direction inclined at 45° to the width direction.

According to the present invention, there is provided an apparatus for manufacturing an organic EL device, in which constituent layers of an organic EL element are formed over a substrate in the form of a strip by deposition, while the substrate is being moved in the longitudinal direction, the apparatus including: an upward deposition unit including an evaporation source arranged below the substrate that is being moved, the upward deposition unit being configured to perform deposition over a deposition surface of the substrate, while the substrate is being moved with its deposition surface facing downward, by discharging a vaporized material from the evaporation source toward the deposition surface; a lateral deposition unit including an evaporation source arranged laterally of the substrate that is being moved, the lateral deposition unit being configured to perform deposition over the deposition surface of the substrate, while the substrate is being moved with its deposition surface facing laterally, by discharging a vaporized material from the evaporation source toward the deposition surface; and a direction changing unit including a guide mechanism provided between the upward deposition unit and the lateral deposition unit, the guide mechanism being configured to turn the substrate conveyed from the upward deposition unit so as to change the facing direction of the deposition surface from downward to lateral, while supporting the substrate from a non-deposition surface side so that the non-deposition surface of the substrate faces the inside of the turn, so as to guide the substrate to the lateral deposition unit.

According to the present invention, there is also provided an apparatus for manufacturing an organic EL device, in which constituent layers of an organic EL element are formed over a substrate in the form of a strip by deposition, while the substrate is being moved in the longitudinal direction, the apparatus including: a lateral deposition unit including an evaporation source arranged laterally of the substrate that is being moved, the lateral deposition unit being configured to perform deposition over a deposition surface of the substrate, while the substrate is being moved with its deposition surface facing laterally, by discharging a vaporized material from the evaporation source toward the deposition surface; an upward deposition unit including an evaporation source arranged below the substrate that is being moved, the upward deposition unit being configured to perform deposition over the deposition surface of the substrate, while the substrate is being moved with its deposition surface facing downward, by discharging a vaporized material from the evaporation source toward the deposition surface; and a direction changing unit including a guide mechanism provided between the lateral deposition unit and the upward deposition unit, the guide mechanism being configured to turn the substrate conveyed from the lateral deposition unit so as to change the facing direction of the deposition surface from lateral to downward, while supporting the substrate from a non-deposition surface side so that the non-deposition surface of the substrate faces the inside of the turn, so as to guide the substrate to the upward deposition unit.

BRIEF DESCRIPTION OF DRAWINGS

FIG. 3 is a schematic plan view of the upper periphery of the guide mechanism on the right in FIG. 1, as seen from the right of FIG. 1.

FIG. 4 is a schematic plan view schematically showing the contact positions with the roller members on a non-deposition surface of a substrate moving through the guide mechanism on the left in FIG. 1.

FIG. 9 shows pictures of the test samples of Example and Comparative Example, as viewed from their organic EL element side.

DESCRIPTION OF EMBODIMENTS

Hereinafter, embodiments of a method and an apparatus for manufacturing an organic EL device according to the present invention are described with reference to the drawings.

First, embodiments of the apparatus for manufacturing an organic EL device according to the present invention are described.

Figure 1:
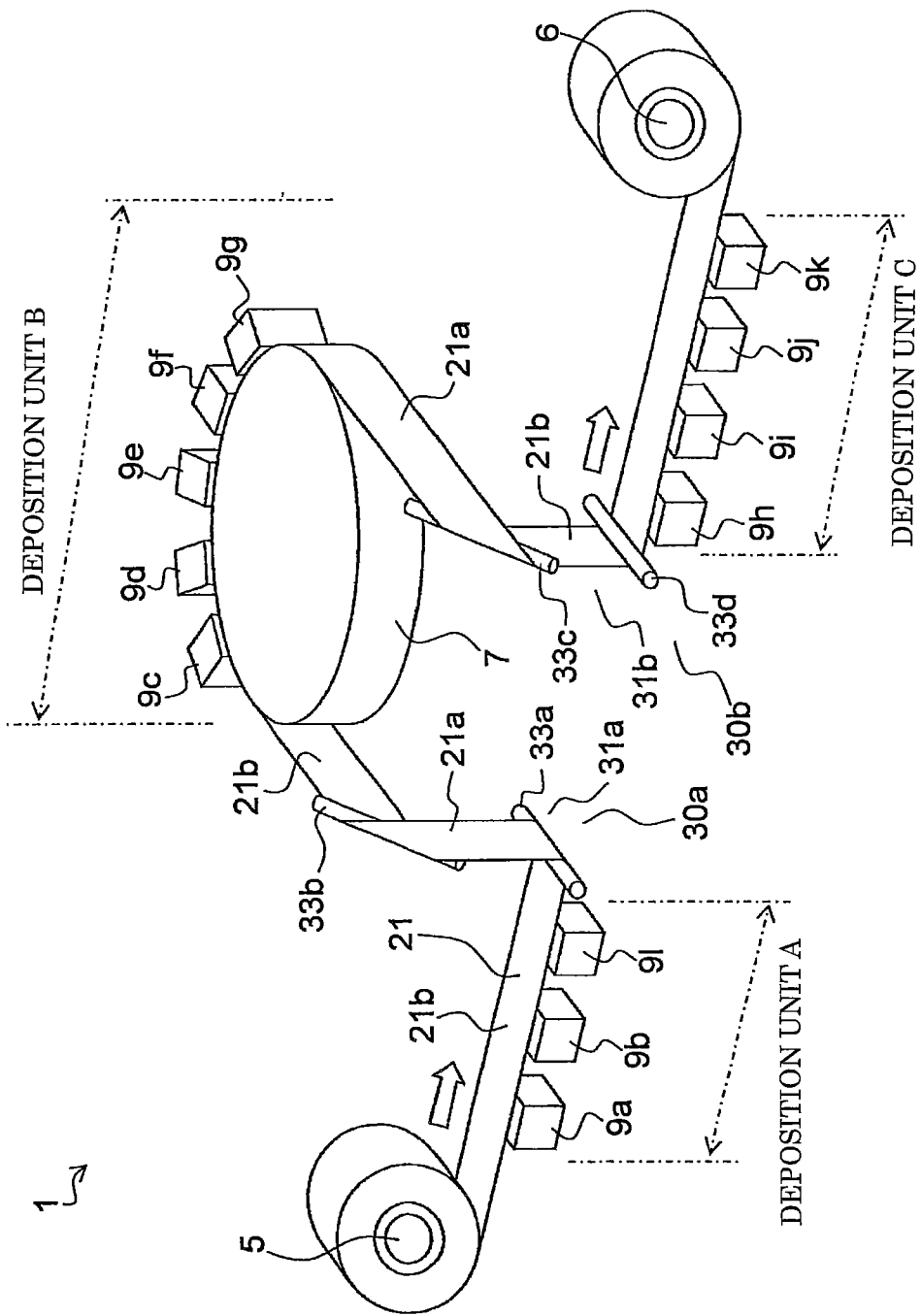
FIG. 1 is a schematic perspective view schematically showing an apparatus for manufacturing an organic EL device according to one embodiment of the present invention.

An organic EL device-manufacturing apparatus 1 is configured to form an organic EL element 19 over a substrate 21 in the form of a strip by deposition while the substrate 21 is being moved in the longitudinal direction. As shown in FIG. 1, the manufacturing apparatus 1 includes deposition units A and C serving as upward deposition units, a deposition unit B serving as a lateral deposition unit, and direction changing units 30a and 30b respectively having guide mechanisms 31a and 31b.

The above-mentioned deposition units A and C include evaporation sources 9a, 9b, 9l, and 9h to 9k below the substrate 21 that is being moved. The deposition units A and C each constitute an upward deposition unit that performs deposition over a deposition surface 21a of the substrate 21, while the substrate 21 is being moved with the deposition surface 21a facing downward, by discharging vaporized materials from the above-mentioned evaporation sources toward the deposition surface 21a.

Further, the above-mentioned deposition unit B includes evaporation sources 9c to 9g provided laterally of the substrate 21 that is being moved. The deposition unit B constitutes a lateral deposition unit that performs deposition over the deposition surface 21a of the substrate 21, while the substrate 21 is being moved so that the deposition surface 21a faces laterally, by discharging vaporized materials from the above-mentioned evaporation sources toward the deposition surface 21a.

The deposition units A to C are arranged along the moving direction of the substrate 21 (see white arrows). The deposition units A to C are arranged from the upstream side to the downstream side in the moving direction of the substrate 21, in the order of the deposition units A, B, and C.

Figure 2:
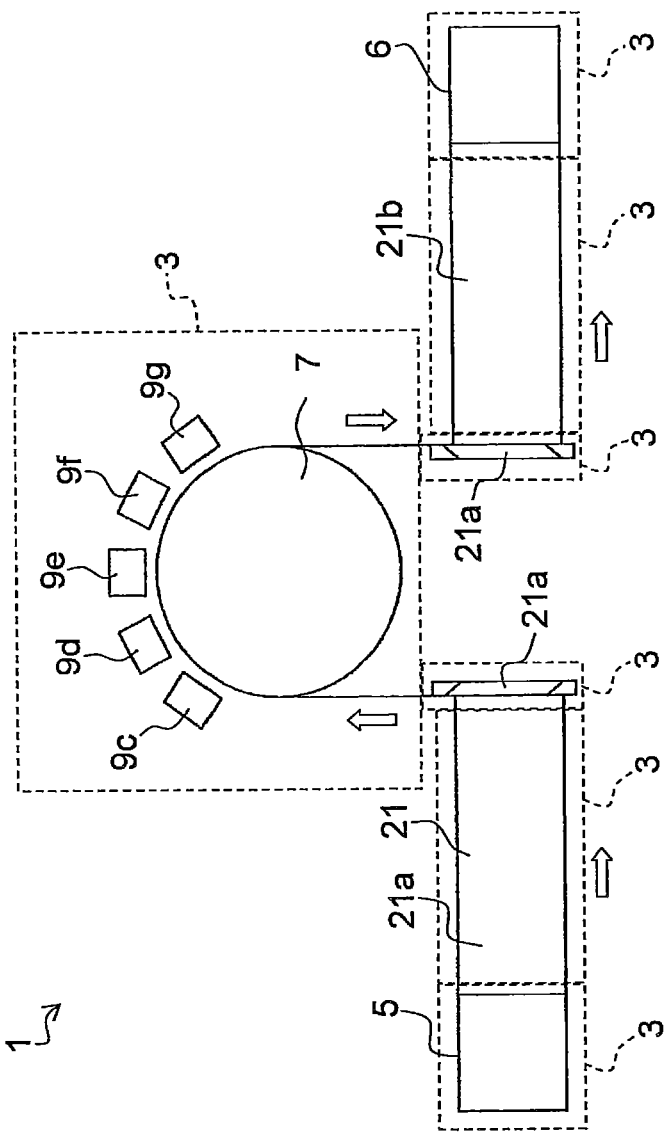
FIG. 2 is a schematic top view schematically showing an apparatus for manufacturing an organic EL device according to one embodiment of the present invention.
Figure 5:
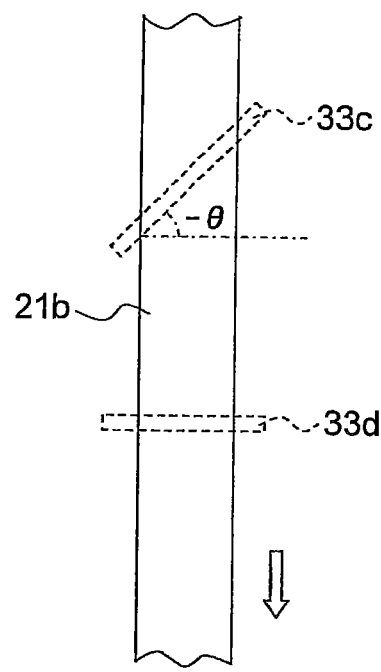
FIG. 5 is a schematic plan view schematically showing the contact positions with the roller members on a non-deposition surface of a substrate moving through the guide mechanism on the right in FIG. 1.

Further, as shown in FIG. 1 and FIG. 2, the direction changing unit 30a is arranged between the deposition unit A (upward deposition unit) and the deposition unit B (lateral deposition unit). The direction changing unit 30b is arranged between the deposition unit B and the deposition unit C (upward deposition unit). The direction changing units 30a and 30b are described later in detail.

The manufacturing apparatus 1 includes a substrate feeding unit 5 provided with a substrate feeding mechanism for feeding the substrate 21. The substrate 21 fed from the substrate feeding unit 5 is sequentially fed to the deposition units A to C, and is moved passing through these units. Further, the manufacturing apparatus 1 includes a substrate take-up unit 6 provided with a substrate take-up mechanism for winding up the substrate 21. The substrate 21 that has passed through the deposition unit C is wound up by the substrate take-up unit 6.

Further, as shown in FIG. 2, the manufacturing apparatus 1 includes a plurality of vacuum chambers 3. In the respective vacuum chambers 3, the substrate feeding unit 5, the deposition unit A, the deposition unit B, the deposition unit C, the direction changing unit 30a, the direction changing unit 30b, and the substrate take-up unit 6 are arranged (see FIG. 1). It should be noted that the vacuum chambers 3 are omitted in the manufacturing apparatus 1 shown in FIG. 1.

The inside of each vacuum chamber 3 is brought into a reduced pressure state by a vacuum generating mechanism (not shown), so that a vacuum region should be formed there-inside. Further, adjacent vacuum chambers 3 are in communication with one another via openings (not shown) while the vacuum state is maintained. Through these openings, the substrate 21 can be moved from the substrate feeding unit 5 sequentially toward the downstream side to the substrate take-up unit 6. Specifically, the substrate 21 unwound from the substrate feeding unit 5 is moved through the deposition unit A, the direction changing unit 30a, the deposition unit B, the direction changing unit 30b, and the deposition unit C, and thereafter is wound up by the substrate take-up unit 6.

The substrate feeding unit 5 unwinds the substrate 21 in the form of a strip wound into a roll, and feeds it to the deposition units A to C. Further, the substrate take-up unit 6 winds up the substrate 21 that has been unwound from the substrate feeding unit 5 and moved through the deposition units A to C into a roll to rewind it. That is, the substrate 21 is unwound and wound up respectively by the substrate feeding unit 5 and the substrate take-up unit 6.

As a material for forming the substrate 21, materials having flexibility that is not damaged when being guided by the guide mechanisms 31a and 31b as described later can be used. Examples of such materials include metal materials, nonmetal inorganic materials, and resin materials.

Examples of the metal materials include stainless steel, alloys such as iron-nickel alloy, copper, nickel, iron, aluminum, and titanium. Further, examples of the above-mentioned iron-nickel alloy include alloy 36 and alloy 42. Among these, the above-mentioned metal material is preferably stainless steel, copper, aluminum, or titanium, from the viewpoint of ease of application to the roll process.

As the above-mentioned nonmetal inorganic materials, glass can be mentioned, for example. In this case, thin film glass to which flexibility is imparted can be used as a substrate formed of a nonmetal inorganic material.

As the above-mentioned resin materials, synthetic resins such as thermosetting resins and thermoplastic resins can be mentioned. Examples of the synthetic resins include a polyimide resin, a polyester resin, an epoxy resin, a polyurethane resin, a polystyrene resin, a polyethylene resin, a polyamide resin, an acrylonitrile-butadiene-styrene (ABS) copolymer resin, a polycarbonate resin, a silicone resin, and a fluororesin. Further, as a substrate formed of such a resin material, films of those synthetic resins mentioned above can be used, for example.

The width, thickness, and length of the substrate 21 are not specifically limited and can be appropriately set depending on the dimensions of the organic EL element 19 formed over the substrate 21, the configuration of the roller members of the guide mechanisms 31a and 31b, etc. The width of the substrate 21 is preferably small, in that elongation of the below-mentioned roller members when being inclined toward the width direction of the substrate 21 as described later can be suppressed.

The evaporation sources 9a, 9b, 9l, and 9h to 9k provided in the deposition units A and C are arranged below the substrate 21. More specifically, the substrate 21 is moved through the deposition units A and C in the substantially horizontal direction with its deposition surface 21a facing downward. Further, the above-mentioned evaporation sources provided in the deposition units A and C are arranged with their openings facing the deposition surface 21a of the substrate 21 in the vacuum chambers 3.

The evaporation sources 9c to 9g provided in the deposition unit B are arranged laterally of the substrate 21. More specifically, the substrate 21 is supported by a can roller 7 having a rotation axis (not shown) in the vertical direction by being hung therearound in the deposition unit B. The substrate 21 moves with the movement of the can roller 7, with the deposition surface 21a facing laterally. The above-mentioned evaporation sources provided in the deposition unit B are arranged with their openings facing the deposition surface 21a of the substrate 21 in the vacuum chambers 3.

Further, the evaporation sources 9a to 9l each have a heating unit (not shown). The heating unit vaporizes the above-mentioned material accommodated in each evaporation source by heating, and the vaporized material is discharged upwardly through the opening.

At least one evaporation source only needs to be provided in each of the deposition units A to C, corresponding to the number of layers to be formed. In this embodiment, the evaporation sources 9a, 9b, and 9l are provided in the deposition unit A, the evaporation sources 9c to 9g are provided in the deposition unit B, and the evaporation sources 9h to 9k are provided in the deposition unit C. Further, the evaporation sources 9a to 9l are each arranged at a position close to the substrate 21. That is, they are each arranged at a position such that the distance (shortest distance) between the substrate 21 and the opening end (nozzle) of each of the evaporation sources 9a to 9l is not more than 10 mm.

Figure 6A:
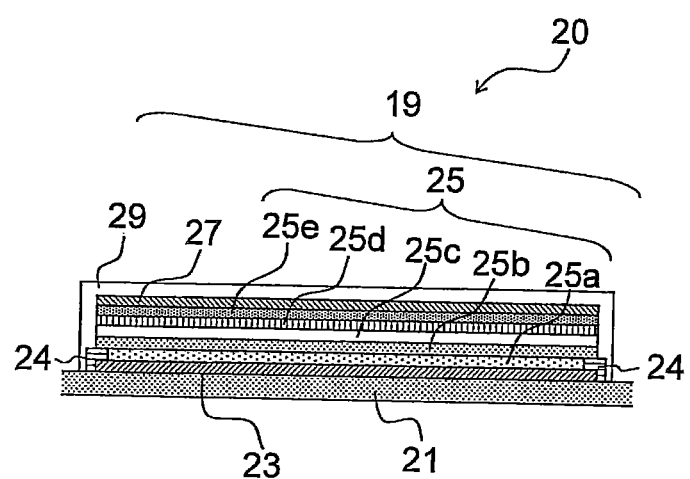
FIG. 6A is a schematic sectional view schematically showing the layer configuration of an organic EL element.
Figure 6B:
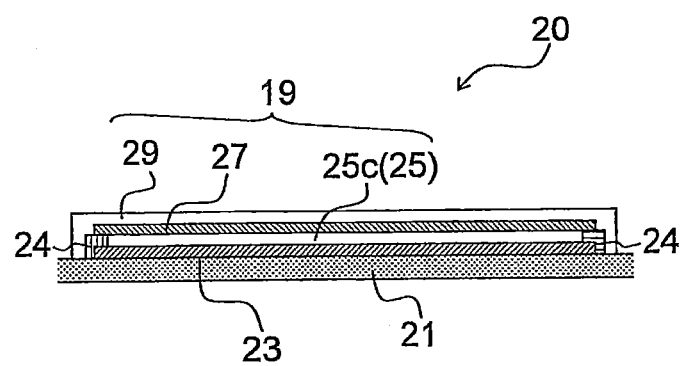
FIG. 6B is a schematic sectional view schematically showing the layer configuration of an organic EL element.
Figure 6C:
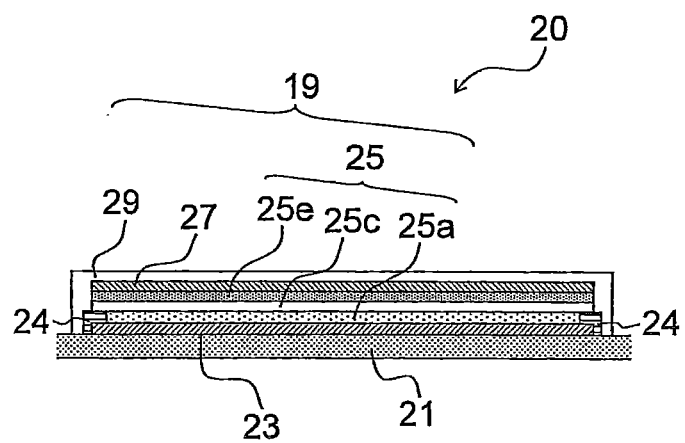
FIG. 6C is a schematic sectional view schematically showing the layer configuration of an organic EL element.

The evaporation source 9a provided in the deposition unit A vaporizes an anode layer-forming material and discharges it, thereby forming an anode layer 23 over the deposition surface 21a of the substrate 21 (see FIG. 6A to FIG. 6C). Further, the evaporation source 9b provided in the deposition unit A vaporizes an edge cover-forming material and discharges it, thereby forming an edge cover 24 that covers the peripheral edges of the anode layer 23 (see FIG. 6A to FIG. 6C). This edge cover covers the periphery of the anode layer 23, thereby preventing the contact between the anode layer 23 and a cathode layer 27.

Further, the evaporation sources 9c to 9g provided in the deposition unit B respectively form five organic EL layer-constituent layers that constitute an organic EL layer 25 (see FIG. 6A to FIG. 6C).

Further, the evaporation sources 9h to 9j provided in the deposition unit C respectively form three cathode layer-constituent layers that constitute the cathode layer 27, and the evaporation source 9k provided in the deposition unit C forms a sealing layer 29 (see FIG. 6A to FIG. 6C). This sealing layer 29 covers the anode layer 23, the organic EL layer 25, and the cathode layer 27, thereby preventing these layers from being in contact with the air.

Further, in this embodiment, the evaporation source 9l in the deposition unit A is provided as a backup. However, it is also possible to form another constituent layer using such an evaporation source.

The anode layer 23 only needs to be formed of at least one anode layer-constituent layer. As a material for forming such an anode layer-constituent layer, gold, silver, aluminum, etc., can be mentioned. In the apparatus configuration shown in FIG. 1, one Al layer is formed as the anode layer 23, for example.

The organic EL layer 25 only needs to be composed of at least one organic EL layer-constituent layer. In the apparatus configuration shown in FIG. 1, a five-layered stack composed of five organic EL layer-constituent layers is formed as the organic EL layer 25. These organic EL layer-constituent layers, for example, are a hole injection layer 25a, a hole transporting layer 25b, a light emitting layer 25c, an electron transporting layer 25d, and an electron injection layer 25e stacked in this order from the anode layer 23 side, as shown in FIG. 6A. The layer configuration of the organic EL layer 25 is not specifically limited, as long as it includes at least the light emitting layer 25c as an organic EL layer-constituent layer. Besides that, the organic EL layer, for example, may be a three-layered stack in which the hole injection layer 25a, the light emitting layer 25c, and the electron injection layer 25e are stacked in this order, as shown in FIG. 6C. Other than that, it may be a four-layered stack excluding the hole transporting layer 25b or the electron transporting layer 25d from the above-mentioned five layers of FIG. 6A, as needed. Furthermore, the organic EL layer may be composed only of one layer of the light emitting layer 25c, as shown in FIG. 6B.

Examples of the material that can be used for forming the hole injection layer 25a include copper phthalocyanine (CuPc), 4,4'-bis[N-4-(N,N-di-m-tolylamino)phenyl]-N-phenylamino]biphenyl (DNTPD), and HAT-CN.

Examples of the material that can be used for forming the hole transporting layer 25b include 4,4'-bis[N-(1-naphthyl)-N-phenyl-amino]biphenyl (α-NPD) and N,N'-diphenyl-N,N'-bis(3-methylphenyl)-1,1'biphenyl-4,4'diamine (TPD).

Examples of the material that can be used for forming the light emitting layer 25c include tris(8-hydroxyquinoline) aluminum (Alq3) and iridium complex (Ir(ppy)3)-doped 4,4'N, N'-dicarbazolyl biphenyl (CBP).

Examples of the material that can be used for forming the electron injection layer 25b include lithium fluoride (LiF), cesium fluoride (CsF), and lithium oxide ($Li_2O$).

Examples of the material that can be used for forming the electron transporting layer 25e include tris(8-hydroxyquinoline) aluminum (Alq3), bis(2-methyl-8-quinolinolato)-4-phenylphenolato-aluminum (BAlq), OXD-7(1,3-bis[5-(p-tert-butylphenyl)-1,3,4-oxadiazole-2-yl])benzene, and lithium fluoride (LiF).

The cathode layer 27 only needs to be formed of at least one cathode layer-constituent layer. As a material for forming the cathode layer-constituent layer, lithium fluoride (LiF), and an alloy containing magnesium (Mg), silver (Ag), or the like, can be used. In the apparatus configuration shown in FIG. 1, a three-layered stack of a LiF layer, a Mg layer, and an Ag layer or a Mg—Ag alloy layer, for example, is formed over the organic EL layer as the cathode layer 27.

As a material for forming the edge cover 24, silicon oxide ($SiO_x$), molybdenum trioxide ($MoO_3$), vanadium pentoxide ($V_2O_5$), or the like, can be mentioned. As a material for forming the sealing layer 29, molybdenum trioxide ($MoO_3$), silicon oxynitride ($SiNO_x$), silicon oxycarbide (SiOC), or the like, can be mentioned. Examples of $SiO_x$ include $SiO_2$. Examples of $SiNO_x$ include SiNO.

The thickness of each of the constituent layers of the anode layer 23, the organic EL layer 25, and the cathode layer 27 mentioned above is generally designed to be about several nm to several tens of nm. However, such thickness is not specifically limited and is appropriately designed depending on the constituent layer-forming materials to be used, the emission properties, etc. Further, the thickness of the edge cover 24 and sealing layer 29 mentioned above is also not specifically limited, and may be appropriately set so as to achieve the functions of these layers, and so as not to inhibit the formation of the anode layer 23, the organic EL layer 25, and the cathode layer 27 mentioned above, or light emission of the organic EL device.

The direction changing units 30a and 30b respectively include the guide mechanisms 31a and 31b.

The guide mechanism 31a is configured to turn the substrate 21 conveyed from the deposition unit A so as to change the facing direction of the deposition surface 21a from downward to lateral, while supporting the substrate 21 from the non-deposition surface 21b side so that the non-deposition surface 21b of the substrate 21 faces the inside of the turn, so as to guide the substrate 21 to the deposition unit B.

Further, the guide mechanism 31b is configured to turn the substrate 21 conveyed from the deposition unit B so as to change the facing direction of the deposition surface 21a from lateral to downward, while supporting the substrate 21 from the non-deposition surface 21b side so that the non-deposition surface 21b of the substrate 21 faces the inside of the turn, so as to guide the substrate 21 to the deposition unit C.

Among these guide mechanisms 31a and 31b, the guide mechanism 31a is first described in detail.

As shown in FIG. 1, FIG. 2, and FIG. 4, the guide mechanism 31a has a plurality of roller members 33a and 33b. These roller members 33a and 33b each are a guide member that guides the substrate 21 to a specific direction. The roller member 33a is arranged in the substantially horizontal direction along the width direction (direction perpendicular to the longitudinal direction) of the substrate 21. The roller member 33b is arranged inclined at an angle θ (which is herein 45°) to the moving direction of the substrate 21.

The angle θ of the roller member to the width direction of the substrate 21 herein means the angle θ at which the roller member is inclined toward the upstream side of the substrate 21 (downward direction in FIG. 4) in the width direction of the substrate 21 (left-right direction in FIG. 4) on the non-deposition surface 21b of the substrate 21.

Further, the roller member 33a is arranged in a lower part of the guide mechanism 31a. The roller member 33b is arranged above the roller member 33a and inclined upwardly at 45° to the horizontal direction.

The substrate 21 conveyed from the deposition unit A is hung over the roller member 33a and the roller member 33b with its non-deposition surface 21b in contact with these roller members. The substrate 21 is guided to the downstream side with the non-deposition surface 21b being supported by these roller members.

Specifically, the substrate 21 is first bent substantially perpendicularly upward around the roller member 33a serving as a support axis, and is then moved to the roller member 33b. Subsequently, the substrate 21 is bent substantially perpendicularly laterally (to the far side in FIG. 1) around the roller member 33b serving as a support axis, and is then moved to the deposition unit B. The substrate 21 is bent around the roller members 33a and 33b serving as support axes, thereby changing the facing direction of the deposition surface 21a from downward, which is the state before being supported by the roller member 33a, to lateral.

In this way, the substrate 21 is bent in the guide mechanism 31a so that the facing direction of the deposition surface 21a is changed from downward to lateral, while being supported from the non-deposition surface 21b side by the guide mechanism 31a so that the non-deposition surface 21b of the substrate 21 faces the inside of the bending. The substrate 21 is conveyed to the deposition unit B in the state where the facing direction of the deposition surface 21a has been changed.

Next, the guide mechanism 31b is described more in detail. As shown in FIG. 1 to FIG. 3 and FIG. 5, the guide mechanism 31b has the same configuration of roller members as the guide mechanism 31a. That is, the guide mechanism 31b has the roller members 33c and 33d. The roller members 33c and 33d respectively correspond to the roller members 33b and 33a of the guide mechanism 31a. Further, the substrate 21 is hung over the roller members 33c and 33d in the guide mechanism 31b, in the same manner as in the guide mechanism 31a. However, the moving direction of the substrate 21 passing on the roller members 33c and 33d is reversed from that of the guide mechanism 31a. Other configurations are the same as those of the guide mechanism 31a. Therefore, description thereof is omitted.

In the guide mechanism 31b, the substrate 21 conveyed from the deposition unit B is guided to the downstream side with the non-deposition surface 21b being supported from the non-deposition surface 21b side by the roller member 33c and the roller member 33d.

Specifically, the substrate 21 is first bent substantially perpendicularly downward around the roller member 33h serving as a support axis, and is then moved to the roller member 33d. Subsequently, the substrate 21 is bent substantially perpendicularly laterally (to the right side in FIG. 1) around the roller member 33d serving as a support axis, and is then moved to the deposition unit C. The substrate 21 is bent around the roller members 33c and 33d serving as supporting axes, thereby changing the facing direction of the deposition surface 21a from lateral, which is the state before being supported by the roller member 33c, to downward.

It should be noted that since the above-mentioned guide mechanism allows bending of the substrate 21 conveyed from the upward deposition unit so as to change the state where the deposition surface 21a faces downward to the state where it faces laterally, the above-mentioned guide mechanism also allows bending of the substrate 21 conveyed from the lateral deposition unit so as to change the state where the deposition surface 21a faces laterally to the state where it faces downward to the contrary to above when the moving direction of the substrate 21 is reversed. That is, it is both possible to change the facing direction of the deposition surface 21a from lateral to downward, and to change it from downward to lateral, using guide mechanisms with the same configuration, by reversing the moving direction of the substrate 21.

The roller member 33b and 33c are each preferably provided with a cylindrical roller body 36, and a plurality of rotatable members 37 projecting outward from the roller body 36 so as to be capable of supporting the substrate 21 on their circumferential surfaces while being rotatably supported on the outer surface of the roller body 36, as shown in FIG. 10 to FIG. 17. That is, the roller members 33b and 33c each preferably have a bearing structure including the roller body 36 and the rotatable members 37.

The roller members 33b and 33c having such a bearing structure can reduce the friction that occurs between the substrate 21 and each roller member when the substrate 21 is moved while being bent around the roller member serving as a support axis. This can prevent the region in which the substrate 21 is in contact with the roller member (contact region) from deviating in the longitudinal direction of the roller member, and is thus effective. Further, since the deviation of the contact region can be prevented in this way, it is also possible to employ a configuration in which the substrate 21 is moved while being wound around the roller member into a spiral by increasing the length of the roller member enough thereto. This increases the contact region of the roller member with the substrate 21, and therefore the substrate is more stably moved (conveyed), which is advantageous.

Figure 10:
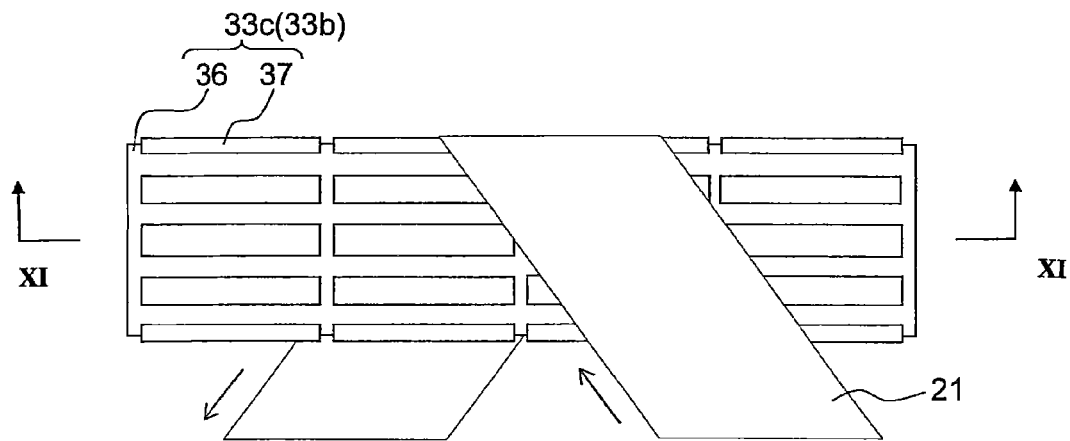
FIG. 10 is a schematic side view showing one embodiment of the roller members.
Figure 11:
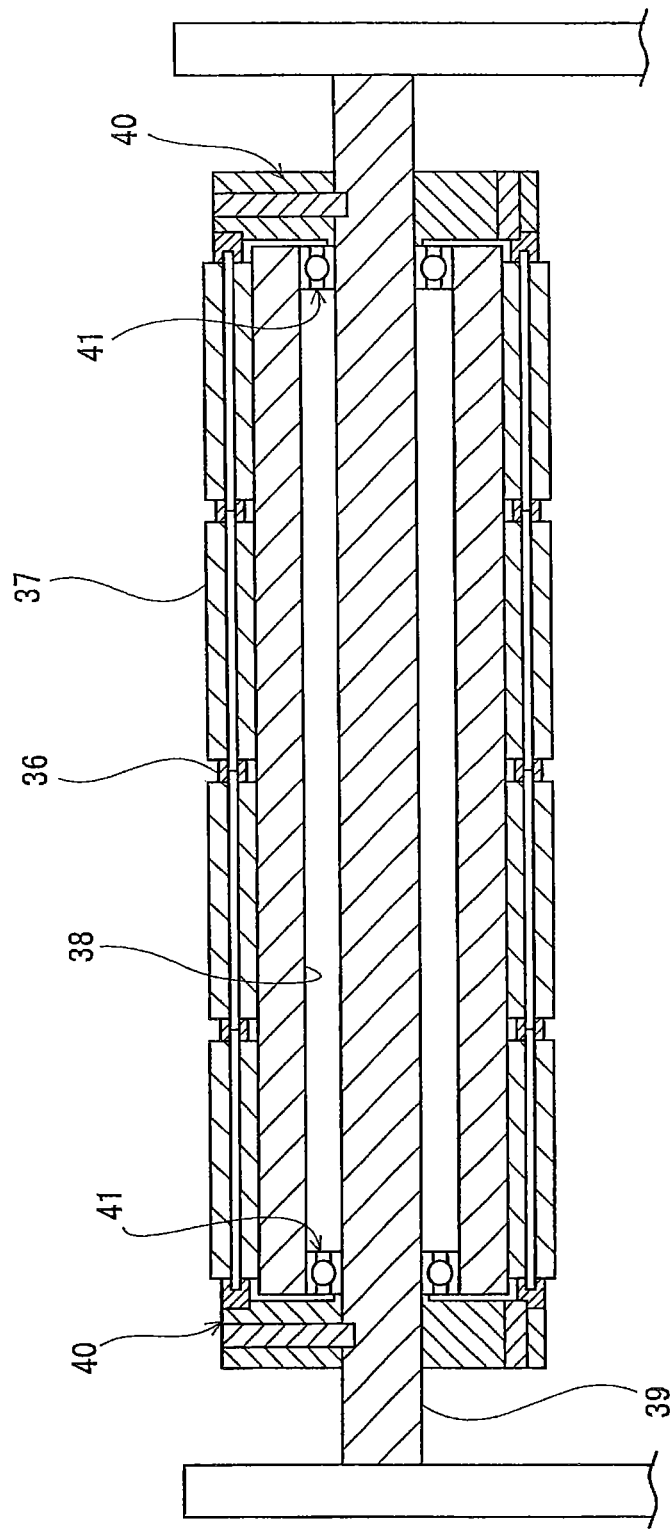
FIG. 11 is a sectional view taken along the line XI-XI of FIG. 10.

In FIG. 10 and FIG. 11, the rotatable members 37 are each a cylindrical needle roller, and the roller member 33b and 33c each have a needle bearing structure including the roller body 36 and the rotatable members 37 that are each a needle roller.

Figure 16:
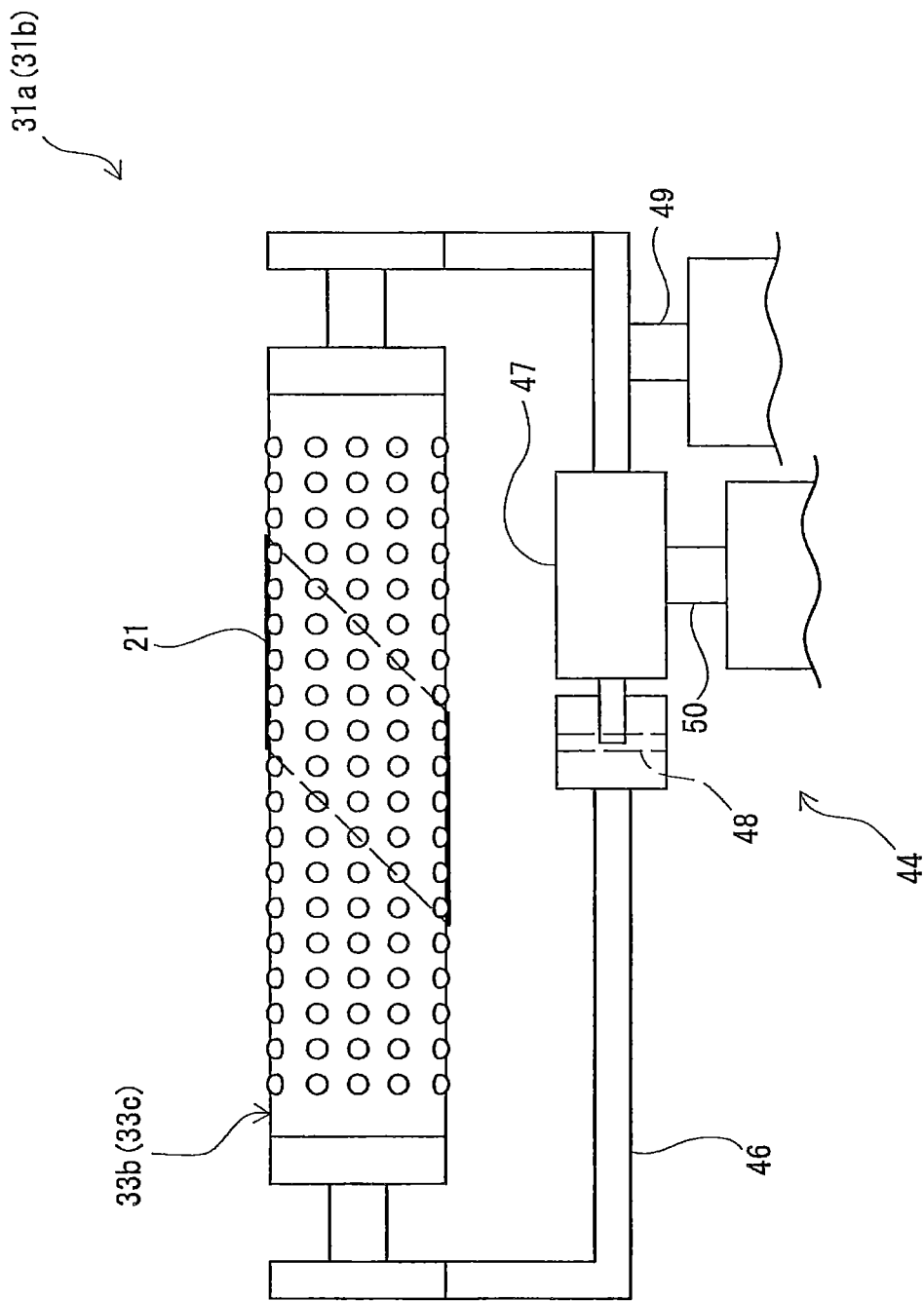
FIG. 16 is a schematic bottom view of the guide mechanism of FIG. 15.

More specifically, a plurality of rolling members 37 shown in FIG. 10 and FIG. 11 are arranged along the circumferential direction over the outer circumference of the guide member 33c (33b) so that the substrate 21 can extend over the rotatable members 37 in contact therewith. Accordingly, when the substrate 21 is hung along the circumferential direction over the outer circumference of the guide member 33c (33b), the direction in which the guide member 33c (33b) rotates and the direction in which the substrate 21 is conveyed match each other. As shown in FIG. 16, the guide member 33c (33d) includes the guide body 36, a support member 38, a shaft 39, securing members 40, and bearings 41, which have the same functions as in the guide member 33c (33b) of the above-mentioned embodiment (see FIG. 10).

Figure 12:
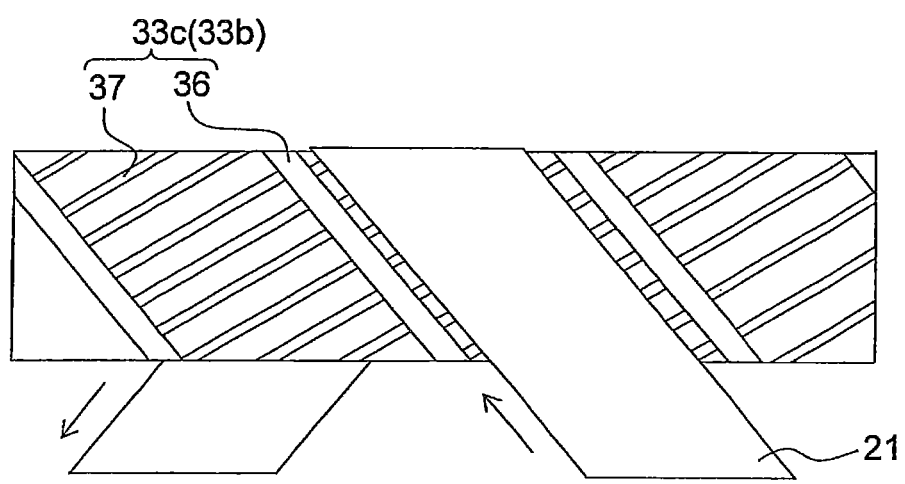
FIG. 12 is a schematic side view showing one embodiment of the roller members.

In FIG. 12, the guide member 33c has the rotatable members 37 that are each a needle roller, in the same manner as in FIG. 10. The rotatable members 37 are arranged in a spiral manner around the roller body 36.

More specifically, the plurality of rolling members 37 shown in FIG. 12 are arranged along the spiral direction over the outer circumference of the guide member 33c (33b) so that the substrate 21 extends over the rolling members 37 in contact therewith. Accordingly, when the substrate 21 is hung along the spiral direction over the outer circumference of the guide member 33c (33b), the direction in which the guide member 33c (33b) rotates and the direction in which the substrate 21 is conveyed match each other. The guide member 33c (33d) includes the guide body 36, and includes, though not shown in the drawings, the support member 38, the shaft 39, the securing members 40, and the bearings 41, which have the same functions as in the guide member 33c (33b) of the above-mentioned embodiment (see FIG. 10).

In FIG. 13 to FIG. 17, the rotatable members 37 are each a spherical ball. The roller members 33b and 33c each have a ball bearing structure including the roller body 36 and the rotatable members 37 that are each a ball.

Figure 13:
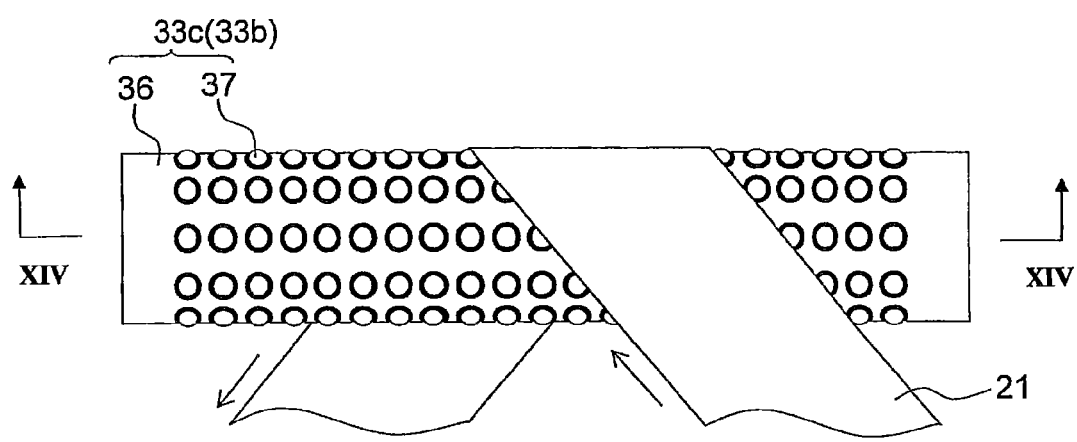
FIG. 13 is a schematic side view showing one embodiment of the roller members.
Figure 14:
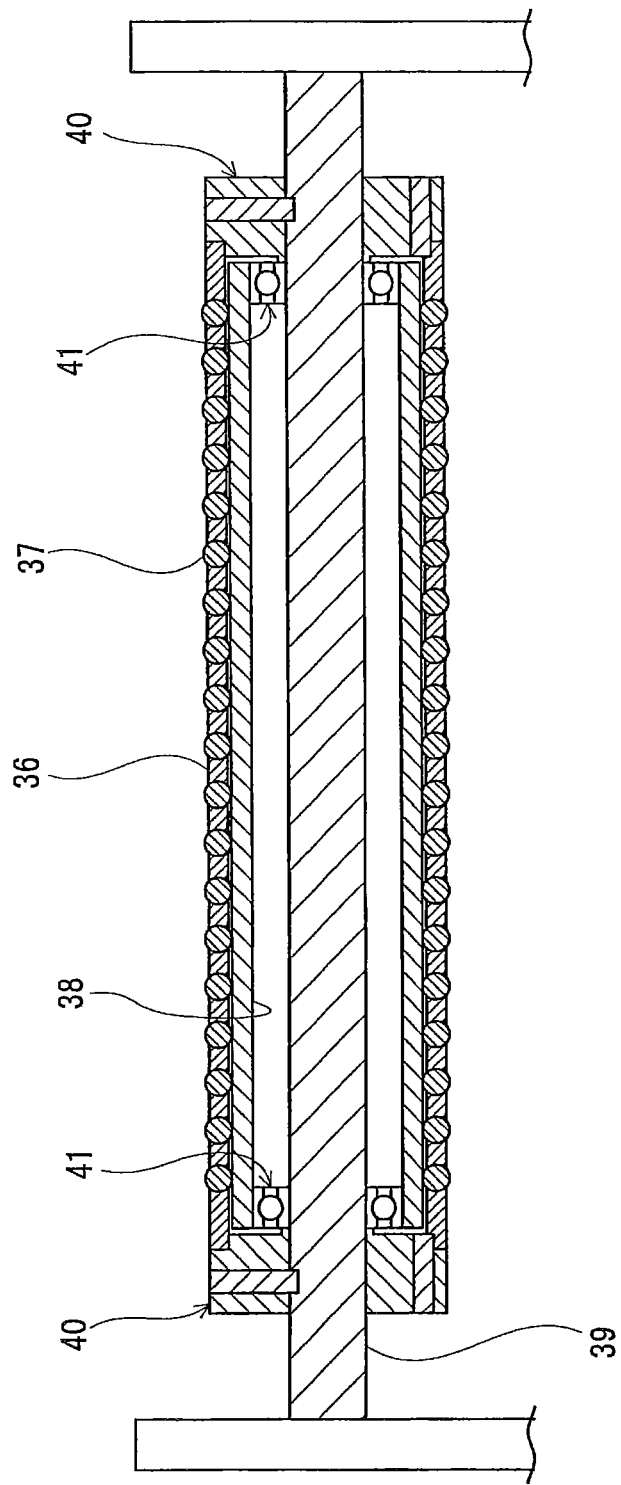
FIG. 14 is a sectional view taken along the line XIV-XIV of FIG. 13.

More specifically, each rolling member 37 is provided so as to partially project from the guide body 36 outwardly in the radial direction of the guide body 36 and partially project from the guide body 36 inwardly in the radial direction of the guide body 36, as shown in FIG. 13 and FIG. 14. Accordingly, the guide members 33b and 33c are each formed so as to have an outer circumferential surface in the form of projections and recesses.

The plurality of rolling members 37 are arranged so that the substrate 21 is brought into contact with the portions projecting outwardly in the radial direction from the guide body 36. Thus, the substrate 21 extends over the plurality of rolling members 37 in contact therewith. In other words, the substrate 21 is hung over the outer circumference of each of the guide members 33b and 33c so as to be in contact with the plurality of rolling members 37 but spaced from the guide body 36. Further, the rolling members 37 are provided so that each portion projecting from the guide body 36 inwardly in the radial direction is in contact with the outer circumference of the support member 38. In this embodiment, the rolling members 37 are each a spherical body that can rotate with three degrees of freedom.

The support member 38 supports the rolling members 37 on its outer circumference. This can prevent the substrate 21 from separating from the guide body 36 or deviating inwardly in the radial direction of the guide body 36, even though the rolling members 37 are subjected to a force applied inwardly in the radial direction of the guide member body 36 from the substrate 21 that is in contact with the rolling members 37.

Further, the bearings 41 allow rotation of the support member 38 about the axis direction (shaft 39). Accordingly, the friction with the rolling members 37 that roll as the substrate 21 is conveyed causes the support member 38 to rotate, which can stabilize the rotational speed of the rolling members 37 (to a substantially uniform rotational speed).

Figure 15:
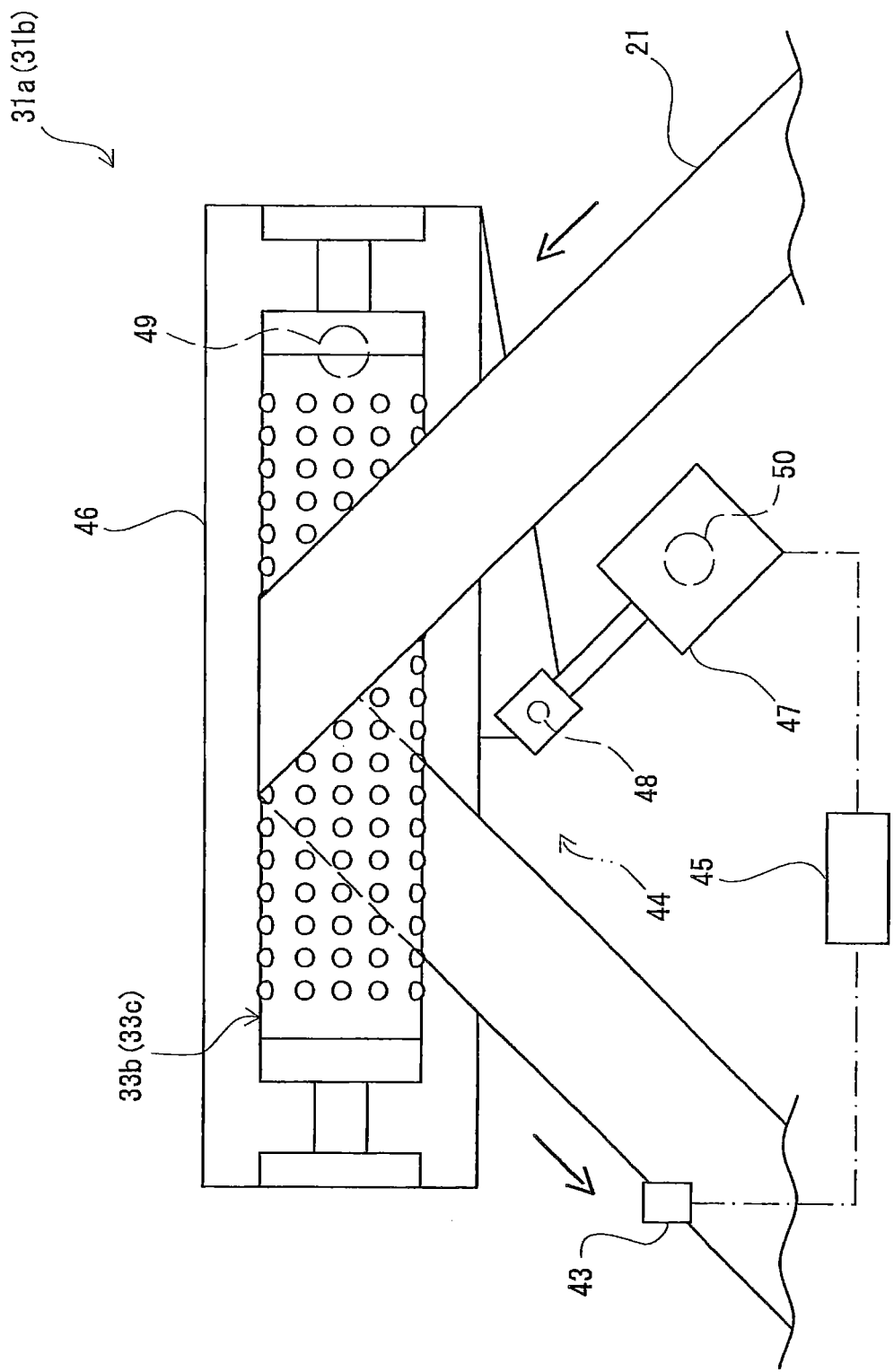
FIG. 15 is a schematic side view showing one embodiment of the guide mechanisms.

Further, as shown in FIG. 15 and FIG. 16, the guide mechanism 31a (31b) includes a substrate position-detecting unit 43 that detects the position of the substrate 21 hung along the spiral direction over the outer circumference of the guide member 33b (33c), a rotation mechanism 44 that rotates the guide member 33b (33c) about the direction intersecting the axis direction of the guide member 33b (33c), and a control unit 45 that controls the rotation mechanism 44 according to the position of the substrate 21 detected by the substrate position-detecting unit 43.

The substrate position-detecting unit 43 is arranged on the downstream side of the guide member 33b (33c). The substrate position-detecting unit 43 detects the position in the width direction of the substrate 21. In this embodiment, a CCD camera is used as the substrate position-detecting unit 43. The substrate position-detecting unit 43 may be a pair of photoelectric sensors arranged respectively on both sides in the width direction of the substrate 21. In short, the substrate position-detecting unit 43 only needs to have a configuration capable of detecting the position of the substrate 21.

The rotation mechanism 44 includes a rotation mechanism body 46 that secures both ends of the shaft 39 of the guide member 33b (33c), a drive mechanism 47 that causes rotational displacement of the rotation mechanism body 46, and a coupling part 48 that rotatably couples the drive mechanism 47 to the rotation mechanism body 46. In this embodiment, the drive mechanism 47 is configured to extend or retract a cylinder by being actuated. The drive mechanism 47 only needs to be capable of causing rotational displacement of the rotation mechanism body 46.

The rotation mechanism 44 includes a body securing unit 49 that rotatably secures the rotation mechanism body 46 to the corresponding vacuum chamber 3, and a drive mechanism securing unit 50 that rotatably secures the drive mechanism 47 to the vacuum chamber 3. The body securing unit 49 secures one side of the rotation mechanism body 46 to the vacuum chamber 3 so that the guide member 33b (33c) can rotate about the one side (the right side in FIG. 15) of the axis direction of the guide member 33b (33c), with the substrate 21 hung along the spiral direction over the guide member 33b (33c) from the one side (the right side in FIG. 15) in the axis direction.

Figure 17:
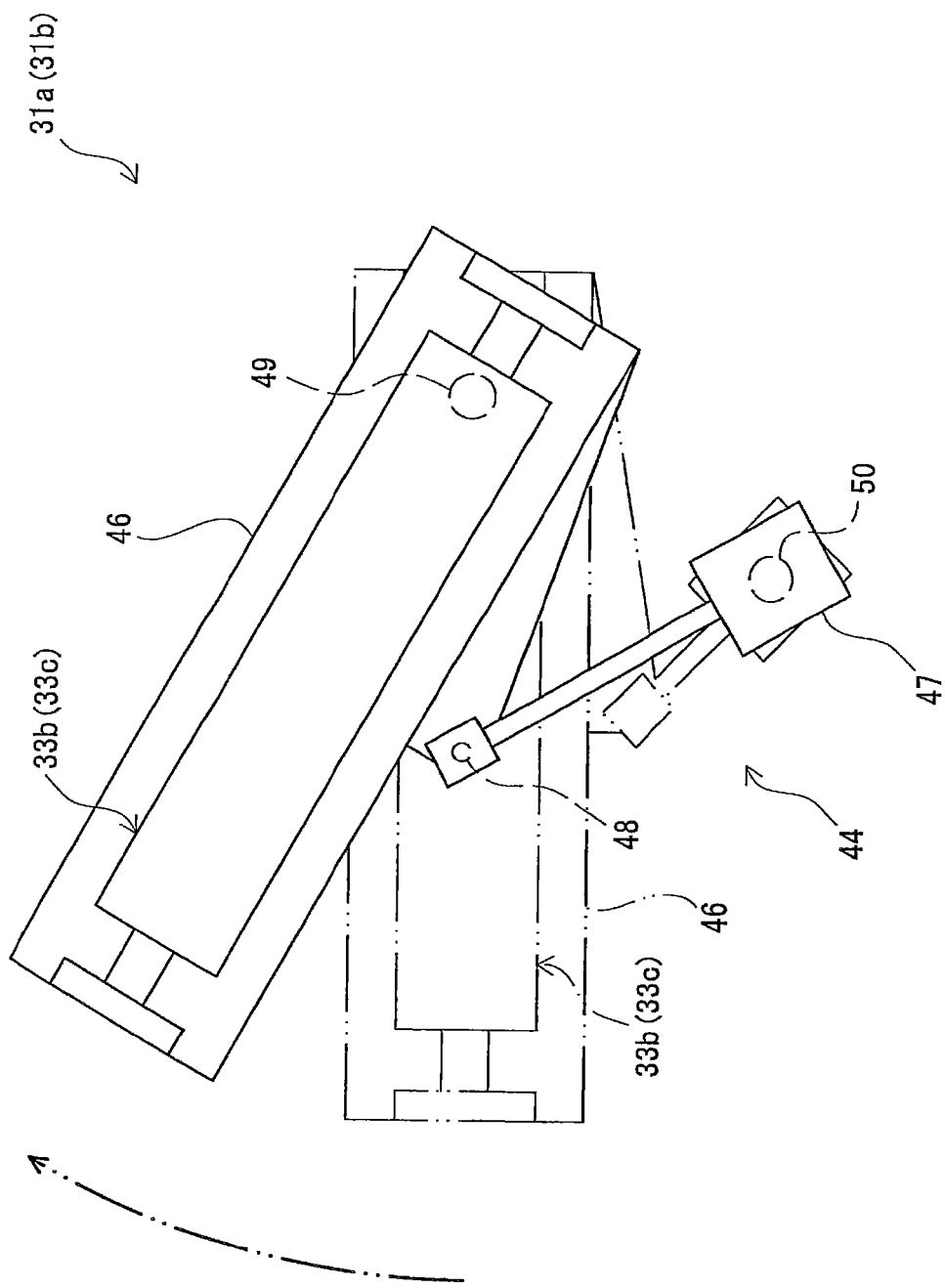
FIG. 17 is a schematic side view illustrating the operation of the guide mechanism of FIG. 15.

The control unit 45 determines, based on the information on the position of the substrate 21 detected by the substrate position-detecting unit 43, whether or not the position of the substrate 21 has deviated. Upon determining that the substrate 21 has deviated from a desired position, the control unit 45 actuates the drive mechanism 47, as shown in FIG. 17, thereby rotating the rotation mechanism body 46, specifically, the guide member 33b (33c) by a given angle.

According to the manufacturing method of this embodiment, the substrate position-detecting unit 43 detects the position in the width direction of the substrate 21 hung along the spiral direction over the outer circumference of the guide member 33b (33c). The control unit 45 controls the rotation mechanism 44 according to the position of the substrate 21 detected by the substrate position-detecting unit 43, thereby rotating the guide member 33b (33c) about the direction intersecting the axis direction of the guide member 33b (33c).

In this way, the control unit 45 rotates the guide member 33b (33c) through the rotation mechanism 44 in the case where the position of the substrate 21 has deviated from a desired position, thereby making it possible to adjust the position of the substrate 21. Accordingly, it is possible to prevent meandering movement of the substrate 21.

According to the description above, the present invention has the following features.

In order to guide a substrate in the form of a strip while supporting it, a guide member having an outer circumference over which the substrate is hung includes a plurality of rolling members (rotatable members) rollably arranged over the outer circumference so that the substrate is in contact therewith.

According to the guide member of the present invention, the plurality of rolling members are arranged over the outer circumference, and the substrate that is being conveyed is in contact with the plurality of rolling members. Accordingly, it is possible to reduce the area in contact with the substrate, for example, as compared to a cylindrical roller member having a smooth outer circumferential surface, thereby suppressing the friction with the substrate.

In addition, since the rolling members are rollable, the rolling members can roll as the substrate is conveyed. Accordingly, it is possible to suppress the friction with the substrate more effectively.

Each rolling member is a spherical body that can rotate with three degrees of freedom. Accordingly, the rolling member can rotate in any direction. Therefore, in whichever direction the substrate is hung over the outer circumference of the guide member, the rolling member can rotate in the conveyance direction of the substrate.

The plurality of rolling members are each a cylindrical body rotatable about the axis direction, and are arranged along the spiral direction over the outer circumference of the guide member. Alternatively, the plurality of rolling members are each a cylindrical body rotatable about the axis direction, and are arranged along the circumferential direction over the outer circumference of the guide member.

Such a configuration can reduce the contact area between the guide member and the substrate hung over the outer circumference of the guide member, and therefore can suppress the friction between the guide member and the substrate.

A guide mechanism includes: the guide member; a substrate position-detecting unit that detects the position in the width direction of the substrate hung along the spiral direction over the outer circumference of the guide member; a rotation mechanism that rotates the guide member about the direction intersecting the axis direction of the guide member; and a control unit that controls the rotation mechanism according to the position of the substrate detected by the substrate position-detecting unit.

According to the guide mechanism of the present invention, the substrate position-detecting unit detects the position in the width direction of the substrate hung along the spiral direction over the outer circumference of the guide member. The control unit controls the rotation mechanism according to the position of the substrate detected by the substrate position-detecting unit, thereby rotating the guide member about the direction intersecting the axis direction of the guide member. In this way, the control unit rotates the guide member through the rotation mechanism in the case where the position of the substrate 21 has deviated from a desired position, thereby making it possible to adjust the position of the substrate. Accordingly, it is possible to prevent meandering movement of the substrate.

Provided is a method for manufacturing an organic EL device in which a vaporized material is deposited over a substrate in the form of a strip that is being conveyed, so that constituent layers of the organic EL element are formed over a deposition surface that is a surface on one side of the substrate. The method includes a direction changing step of changing the facing direction of the deposition surface of the substrate using a guide member.

Next, embodiments of a method for manufacturing an organic EL device using the above-mentioned manufacturing apparatus are described.

In the method for manufacturing an organic EL device according to this embodiment, constituent layers of the organic EL element 19 are formed over the substrate in the form of a strip by deposition, while the substrate 21 is being moved in the longitudinal direction.

This manufacturing method includes a constituent layer forming step of performing deposition over one surface of the substrate 21, while the substrate 21 is being moved in the longitudinal direction, sequentially in the deposition units A to C (at least one upward deposition unit and one lateral deposition unit) arranged along the moving direction of the substrate 21 by discharging vaporized materials from evaporation sources 9a to 9k.

Further, the above-mentioned constituent layer-forming step includes: an upward deposition step of performing deposition over the deposition surface 21a, while the substrate 21 is being moved with the deposition surface 21a facing downward, in the deposition unit A (upward deposition unit) by discharging vaporized materials from the evaporation sources 9a and 9b arranged below the substrate 21; a lateral deposition step of performing deposition over the deposition surface 21a, while the substrate 21 is being moved with the deposition surface 21a facing laterally, in the deposition unit B (lateral deposition unit) by discharging vaporized materials from the evaporation sources 9c to 9g arranged laterally of the substrate 21; and a direction changing step of turning the substrate 21 conveyed from the deposition unit A so as to change the facing direction of the deposition surface 21a from downward to lateral, using the guide mechanism 31a provided between the deposition unit A and the deposition unit B, while supporting the substrate 21 from the non-deposition surface 21b side so that the non-deposition surface 21b of the substrate 21 faces the inside of the turn, so as to guide the substrate 21 to the deposition unit B.

Furthermore, the above-mentioned constituent layer-forming step includes: a lateral deposition step of performing deposition over the deposition surface 21a, while the substrate 21 is being moved with the deposition surface 21a facing laterally, in the deposition unit B (lateral deposition unit) by discharging vaporized materials from the evaporation sources 9c to 9g arranged laterally of the substrate 21; an upward deposition step of performing deposition over the deposition surface 21a, while the substrate 21 is being moved with the deposition surface 21a facing downward, in the deposition unit C (upward deposition unit) by discharging vaporized materials from the evaporation sources 9h to 9k arranged below the substrate 21; and a direction changing step of turning the substrate 21 conveyed from the deposition unit B so as to change the facing direction of the deposition surface 21a from lateral to downward, using the guide mechanism 31b provided between the deposition unit B and the deposition unit C, while supporting the substrate 21 from the non-deposition surface 21b side so that the non-deposition surface 21b of the substrate 21 faces the inside of the turn, so as to guide the substrate 21 to the deposition unit C.

Specifically in this embodiment, the substrate 21 wound into a roll is first unwound from the substrate feeding unit 5, for example.

Subsequently, the anode layer 23 (for example, an Al layer) is formed in the deposition unit A by discharging an anode layer-forming material upward from the evaporation source 9a toward the lower surface (deposition surface) of the substrate 21, while the unwound substrate 21 is being moved. Then, an edge cover forming material is discharged from the evaporation source 9b, thereby forming the edge cover 24 so as to cover the peripheral edges of the anode layer 23 (upward deposition step).

Subsequently, the substrate 21 conveyed from the deposition unit A (upward deposition unit) on the upstream side with the deposition surface 21a facing downward is bent in the guide mechanism 31a so that the facing direction of the deposition surface 21a is changed to lateral, while being supported by the guide mechanism 31a from the non-deposition surface 21b side so that the non-deposition surface 21b of the substrate 21 faces the inside of the bending. Then, the substrate 21 is guided to the deposition unit B (lateral deposition unit) on the downstream side with the deposition surface 21a facing laterally (direction changing step).

In the deposition unit B, five organic EL layer-constituent layers (for example, a hole injection layer, a hole transporting layer, a light emitting layer, an electron transporting layer, and an electron injection layer) are formed by discharging materials for forming organic EL layer-constituent layers from the evaporation sources 9c to 9g arranged laterally of the substrate 21 toward the deposition surface 21a of the substrate 21, while the substrate 21 conveyed from the guide mechanism 31a is being moved (lateral deposition step).

Subsequently, the substrate 21 conveyed from the deposition unit B (lateral deposition unit) on the upstream side with the deposition surface 21a facing laterally is bent in the guide mechanism 31b so that the facing direction of the deposition surface 21a is changed to downward, while being supported by the guide mechanism 31b from the non-deposition surface 21b side so that the non-deposition surface 21b of the substrate 21 faces the inside of the bending. Then, the substrate 21 is guided to the deposition unit C (upward deposition unit) on the downstream side with the deposition surface 21a facing downward (direction changing step).

In the deposition unit C, the cathode layer 27 composed of three cathode layer-constituent layers (for example, a LiF layer, a Mg layer, and an Ag layer) is formed by discharging cathode layer-forming materials upward from the evaporation sources 9h to 9j arranged below the substrate 21 toward the deposition surface 21a of the substrate 21, while the substrate 21 conveyed from the guide mechanism 31b is being moved. A sealing layer (for example, $MoO_3$ layer) 29 is formed by discharging a sealing layer-forming material upward from the evaporation source 9k (upward deposition step).

As described above, the organic EL element 19 can be formed over the substrate 21. Further, while the organic EL element 19 is being formed over the substrate 21, the substrate 21 over which the organic EL element 19 has been formed is wound up by the substrate take-up unit 6.

In this way, an organic EL device 20 can be manufactured. In this embodiment, the organic EL device 20 includes the substrate 21, the organic EL element 19, the edge cover 24, and the sealing layer 29. The organic EL element 19 includes the anode layer 23, the organic EL layer 25, and the cathode layer 27.

According to such a manufacturing method, in the case where the deposition unit on the upstream side is the deposition unit A (upward deposition unit), after constituent layers have been formed over the deposition surface 21a of the substrate 21 that faces downward by discharging vaporized materials upward from the evaporation sources 9a and 9b, the guide mechanism 31a turns the substrate 21 over which the constituent layers have been formed so as to change the facing direction of the deposition surface 21a from downward to lateral, thus guiding the substrate 21 to the deposition unit B on the downstream side with the deposition surface 21a facing laterally. Subsequently, in the deposition unit B on the downstream side (lateral deposition unit), constituent layers can be continuously formed over the deposition surface 21a of the substrate 21 that faces laterally by discharging vaporized materials laterally from the evaporation sources 9c to 9g.

On the other hand, in the case where the deposition unit on the upstream side is the deposition unit B (lateral deposition unit), after constituent layers have been formed over the deposition surface 21a of the substrate 21 that faces laterally by discharging vaporized materials from the lateral side using the evaporation sources 9c to 9g, the guide mechanism 31b turns the substrate 21 over which the constituent layers have been formed so as to change the facing direction of the deposition surface 21a from lateral to downward, thus guiding the substrate 21 to the deposition unit C (upward deposition unit) on the downstream side with the deposition surface 21a facing downward. Subsequently, in the deposition unit C, constituent layers can be continuously formed over the deposition surface 21a of the substrate 21 that faces downward by discharging vaporized materials from below using the evaporation sources 9h to 9k.

In this way, it is possible to prevent incorporation of foreign matter dropped from the evaporation sources 9a to 9k by discharging vaporized materials downward and laterally from the evaporation sources 9a to 9k (or 9a to 9l, the same applies to the followings) in the deposition units A to C. It is therefore possible to prevent light emission failure due to incorporation of such foreign matter.

Further, it is possible to give a desired tension to the substrate 21 by supporting the substrate 21 between the deposition units A to C (between each upward deposition unit and the lateral deposition unit), thereby suppressing warpage and vibration of the substrate 21. This can reduce the damage on the deposition surface 21a of the substrate 21 due to the contact with the evaporation sources 9a to 9k. Furthermore, it is also possible to suppress variation in the distance between the substrate 21 and each of the evaporation sources 9a to 9k, so as to control the thickness of constituent layers appropriately. This can suppress the degradation in emission properties.

Moreover, supporting the non-deposition surface 21b of the substrate 21 can reduce the damage on the deposition surface 21a of the substrate.

Accordingly, the organic EL device 20 capable of suppressing quality degradation can be manufactured.

Furthermore, the guide mechanisms 31a and 31b provided between the deposition units A and C each can change the moving direction viewed from above of the substrate 21 between before and after the substrate 21 is guided by the guide mechanisms 31a and 31b. This makes it possible to arrange the deposition units A to C at desired positions. Accordingly, the degree of freedom in layout for the deposition units A to C can be enhanced. Further, production space also can be effectively used.

Further, the guide mechanisms 31a and 31b have the plurality of roller members 33a to 33d that support the non-deposition surface 21b in this embodiment. At least one of the roller members of each guide mechanism is arranged along a direction inclined to the width direction of the substrate. This facilitates to change the facing direction of the deposition surface 21a of the substrate 21, as mentioned above, with a simple configuration of combining such roller members, which is therefore more efficient.

Further, in this embodiment, at least one of the above-mentioned roller members is arranged along a direction inclined at 45° to the width direction of the substrate 21. This can prevent complicated combination of the roller members, and prevent an increase in size of the apparatus, as well.

The method and apparatus for manufacturing an organic EL device of the present invention are as described above. However, the present invention is not limited to the above-mentioned embodiments of the present invention, and the design can be appropriately modified within the scope intended by the present invention. For example, the configuration of each guide mechanism is not specifically limited to the above-mentioned embodiments. It is also possible to employ the arrangement or number of roller members other than above, or a combination thereof, as long as the guide mechanism is capable of turning the substrate conveyed from the deposition unit on the upstream side so as to change the facing direction of the deposition surface from downward to lateral, or from lateral to downward, while supporting the substrate from the non-deposition surface side so that the non-deposition surface of the substrate faces the inside of the turn, and guiding the substrate to the deposition unit on the downstream side with the facing direction of the deposition surface changed. Further, although the substrate after the completion of the deposition step is wound up in the above-mentioned embodiments, the substrate may be subjected to another step, such as cutting, without winding-up.

Next, the present invention is described further in detail by way of examples. However, the present invention is not limited to these examples.

EXAMPLE

The same manufacturing apparatus as the manufacturing apparatus 1 shown in FIG. 1 was used, and a structure composed of one anode layer, five organic EL layers, and one cathode layer was employed. Further, the shortest distance between the substrate and each evaporation source was set to 2 mm. Using the manufacturing apparatus, an anode layer (Al), an edge cover ($SiO_2$), a hole injection layer (HAT-CN), a hole transporting layer (α-NPD), a light emitting layer (Alq3), an electron transporting layer (LiF), an electron injection layer (LiF), a cathode layer (Mg-Ai alloy), and a sealing layer ($MoO_3$) were sequentially deposited over the substrate (SUS) 21 in this order. Thus, an organic EL device was produced.

Figure 8:
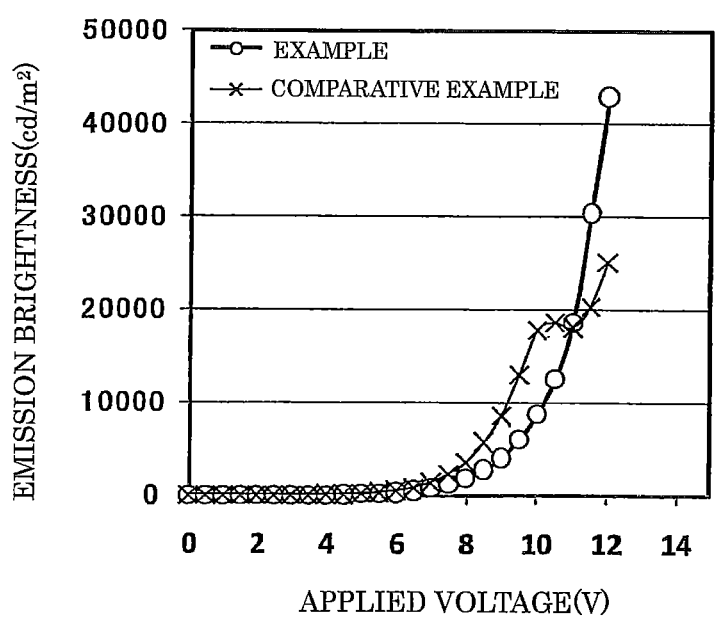
FIG. 8 is a graph showing the relationship between applied voltage and emission brightness in the test samples of Example and Comparative Example.

The thus obtained organic EL device was cut into dimensions of 30 cm (in the moving direction of the substrate)×3.8 cm (in the width direction of the substrate) to produce test samples. A voltage was applied to the anode layer and the cathode layer of the resultant test samples, and the relationship between the applied voltage (V) and the emission brightness ($cd/m^2$) was investigated. The emission brightness was measured using an organic EL light emission efficiency measuring apparatus (EL-1003, manufactured by PRECISE GAUGES co., ltd.). Pictures of the test samples after the voltage application, as viewed from their organic EL element side, were taken with a digital microscope (VHX-1000, manufactured by KEYENCE CORPORATION). FIG. 8 shows the thus obtained relationship between the applied voltage and the emission brightness. FIG. 9 shows the pictures of the test samples after the voltage application.

As shown in FIG. 8, current leakage was not recognized even when a voltage was applied to the anode layer and the cathode layer of the organic EL device obtained above. Breakage of the organic EL device due to current leakage was not recognized after the application of voltage, as shown in FIG. 9.

Comparative Example

Figure 7:
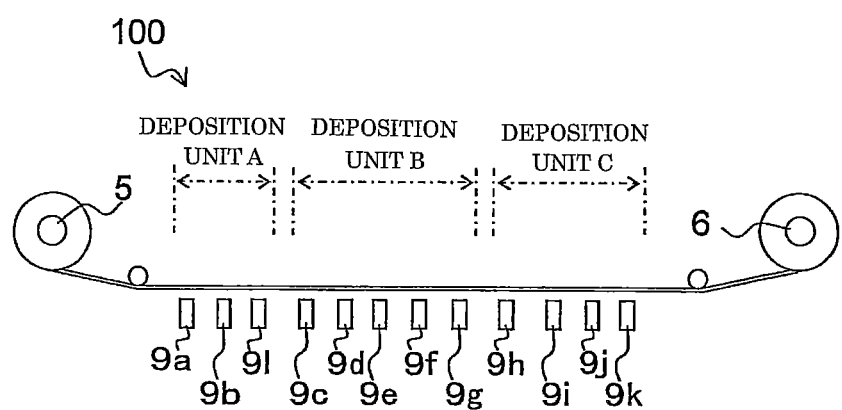
FIG. 7 is a schematic side view schematically showing a manufacturing apparatus used in Comparative Example.

The same manufacturing apparatus as the manufacturing apparatus 100 shown in FIG. 7 was used. That is, as a manufacturing apparatus, the same manufacturing apparatus as in FIG. 1 except that the deposition units A to C were linearly arranged and the guide mechanisms were not provided between the deposition units A and C was used. It should be noted that illustration of vacuum chambers is omitted in the manufacturing apparatus shown in FIG. 7.

Using this manufacturing apparatus, an organic EL device was produced in the same manner as in Example. As a result, the substrate warped, and the deposition surface of the substrate and each evaporation source were brought into contact, thus causing abrasion on the deposition surface of the substrate. Further, test samples obtained from this organic EL device in the same manner as in Example were subjected to evaluation. FIG. 8 shows the thus obtained relationship between the applied voltage and the emission brightness. FIG. 9 shows the pictures of the test samples after the voltage application. As shown in FIG. 8, current leakage resulting from the above-mentioned abrasion on the deposition surface of the substrate was recognized in Comparative Example.

Further, due to such current leakage, breakage of the organic EL device was recognized after the voltage application, as shown in FIG. 9.

It has been found from the above results that the method and the apparatus for manufacturing an organic EL device according to the present invention make it possible to manufacture an organic EL device capable of suppressing quality degradation.

The present invention is as described above. However, the present invention is not limited to the above-mentioned embodiments of the present invention, and the design can be appropriately modified within the scope intended by the present invention.

Further, the guide members 33b and 33c according to the embodiments described herein has a configuration in which the support member 38 is rotatable with respect to the shaft 39, which however is not restrictive. For example, it is also possible to employ a configuration in which the support member 38 is secured to the shaft 39 so as not to rotate with respect to the shaft 39, even if the rolling members 37 are rotated.

Further, the guide members 33b and 33c according to the embodiments described herein has a configuration in which the guide body 36 is secured to the shaft 39 and thus does not rotate with respect to the shaft 39 when the substrate 21 is conveyed, which however is not restrictive. For example, it is also possible to employ a configuration in which the guide body 36 is rotatable with respect to the shaft 39 and thus rotates with respect to the shaft 39 as the substrate 21 is conveyed.

Further, the guide members 33b and 33c according to the embodiments described herein has a configuration in which a plurality of rolling members 37 are arranged over the entire region in the circumferential direction and the entire region in the axis direction (longitudinal direction) of the guide body 36, which however is not restrictive. The rolling members 37 at least need to be arranged in the contact region of the guide members 33b and 33c with the substrate 21.

Further, it is also possible to employ the guide mechanism with a configuration in which the arrangement, number, or combination of guide members is changed. Further, although the substrate after the completion of deposition steps is wound up in the above-mentioned embodiments, the substrate may be subjected to another step, such as cutting, without winding-up.

FIG. 18 to FIG. 21 show other embodiments of the apparatus for manufacturing an organic EL device according to the present invention.

Figure 18:
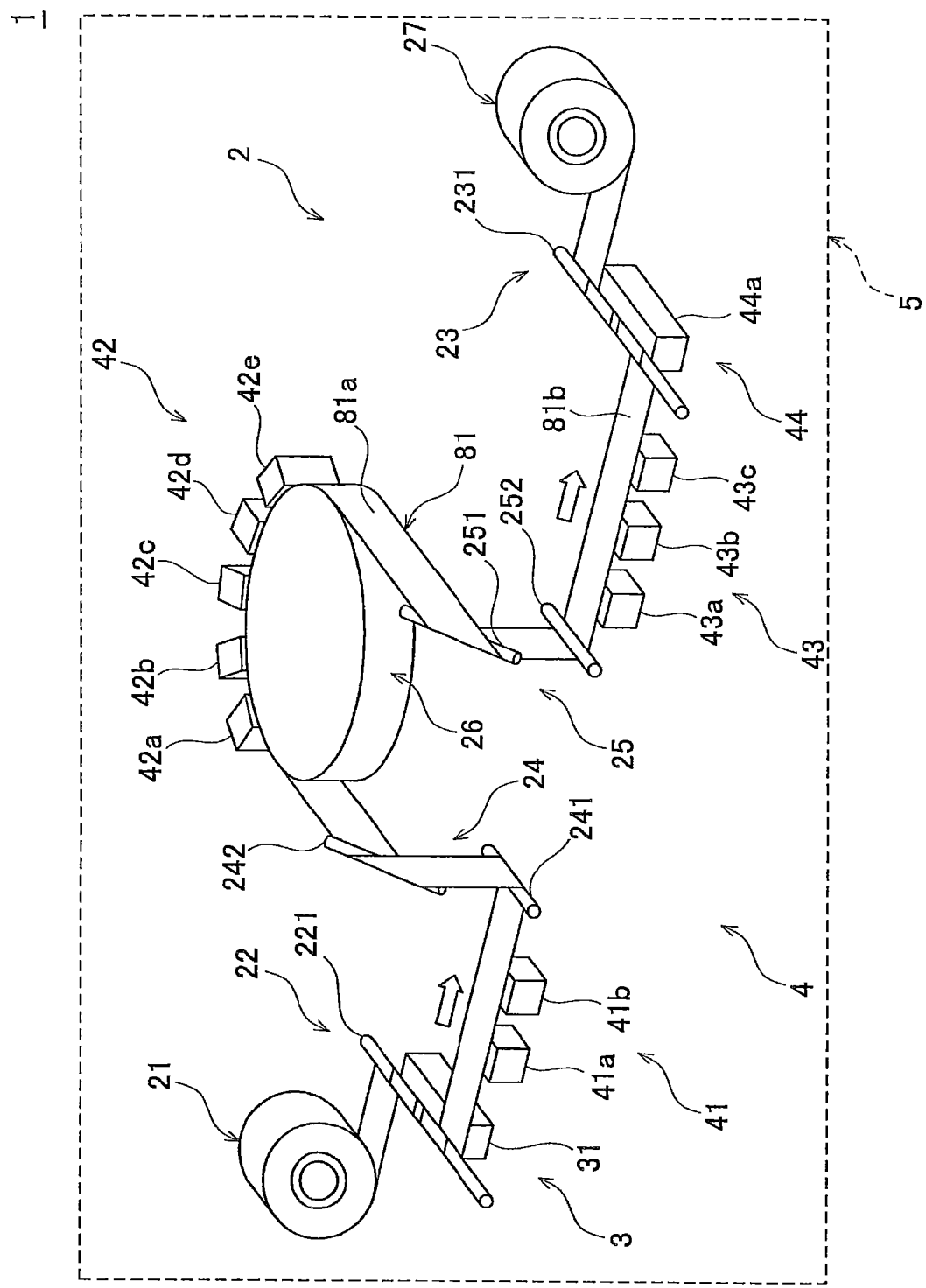
FIG. 18 is an overall perspective view showing an apparatus for manufacturing an organic EL device according to one embodiment of the present invention.

As shown in FIG. 18, the apparatus for manufacturing an organic EL device (which hereinafter may be referred to simply as "manufacturing apparatus") 1 according to this embodiment includes a conveyance mechanism 2 that conveys a substrate 81 in the form of a strip in the longitudinal direction, a heating mechanism 3 that heats the substrate 81, and a deposition mechanism 4 that deposits a vaporized material over a deposition surface 81a that is one surface of the substrate 81 to be conveyed. Further, the manufacturing apparatus 1 includes a vacuum chamber 5 that accommodates the mechanisms 2 to 4 in a vacuum state.

The conveyance mechanism 2 includes a substrate feeding unit 21 that unwinds the substrate 81 in the form of a strip wound into a roll for feeding, and a pair of spiral conveyance units 22 and 23 respectively having guide members (which hereinafter may be referred to as "spiral guide members") 221 and 231 around the outer circumferences of which the substrate 81 is wound along the spiral direction with at least one turn (two turns in this embodiment).

The conveyance mechanism 2 includes a pair of direction changing units 24 and 25 that change the facing direction of the deposition surface 81a of the substrate 81, a can roller (guide member) 26 that rotates about a rotation axis along the vertical direction and supports the substrate 81 with the substrate 81 being wound and hung around its outer circumference, and a substrate take-up unit 27 that winds up the substrate 81 again into a roll.

In the conveyance mechanism 2, the substrate feeding unit 21, the first spiral conveyance unit 22, the first direction changing unit 24, the can roller 26, the second direction changing unit 25, the second spiral conveyance unit 23, and the substrate take-up unit 27 are arranged in this order from the upstream side. Further, the substrate 81 is conveyed from the substrate feeding unit 21 with the deposition surface 81a facing downward, then is turned by the first direction changing unit 24 so that the deposition surface 81a faces laterally, thereafter is turned again by the second direction changing unit 25 so that the deposition surface 81a faces downward, and is conveyed to the substrate take-up unit 27.

The first spiral conveyance unit 22 is provided with the first spiral guide member 221 arranged along the horizontal direction. The substrate 81 conveyed from the substrate feeding unit 21 comes into contact with the first spiral guide member 221 from the lower side of the outer circumference of the first spiral guide member 221, and then is wound twice (makes two turns) around the outer circumference and conveyed away from the lower side of the outer circumference to the first direction changing unit 24. Accordingly, the substrate 81 passes on the lower side of the first spiral guide member 221 three times.

The second spiral conveyance unit 23 has the second spiral guide member 231 arranged along the horizontal direction. The substrate 81 conveyed from the second direction changing unit 25 comes into contact with the second spiral guide member 231 from the lower side of the outer circumference of the second spiral guide member 231, and then is wound twice (makes two turns) around the outer circumference and conveyed away from the lower side of the outer circumference to the substrate take-up unit 27. Accordingly, the substrate 81 passes on the lower side of the second spiral guide member 231 three times.

Figure 19:
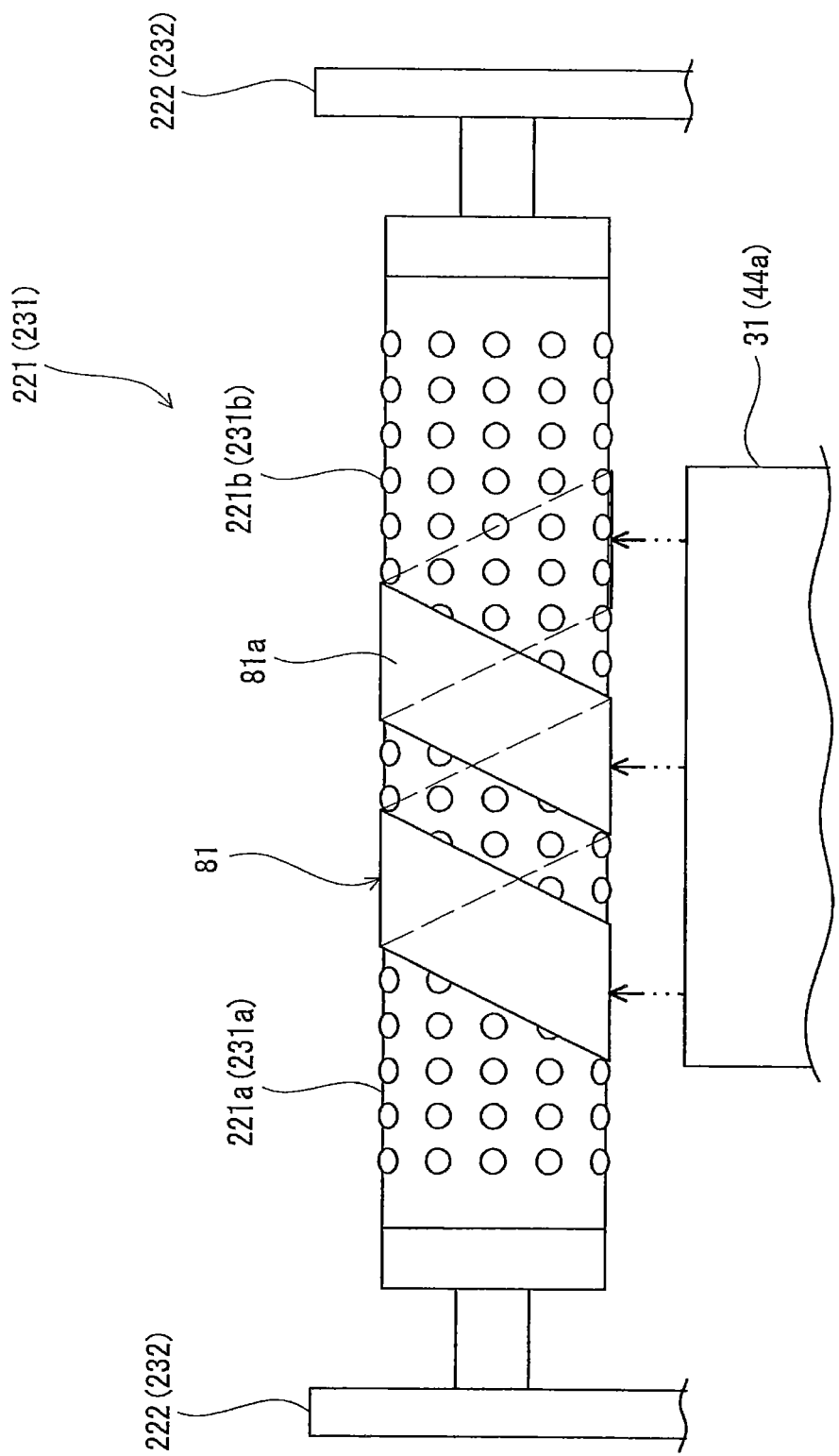
FIG. 19 is an overall view of a guide member according to the one embodiment, as viewed from the front, with the substrate being hung therearound.
Figure 20:
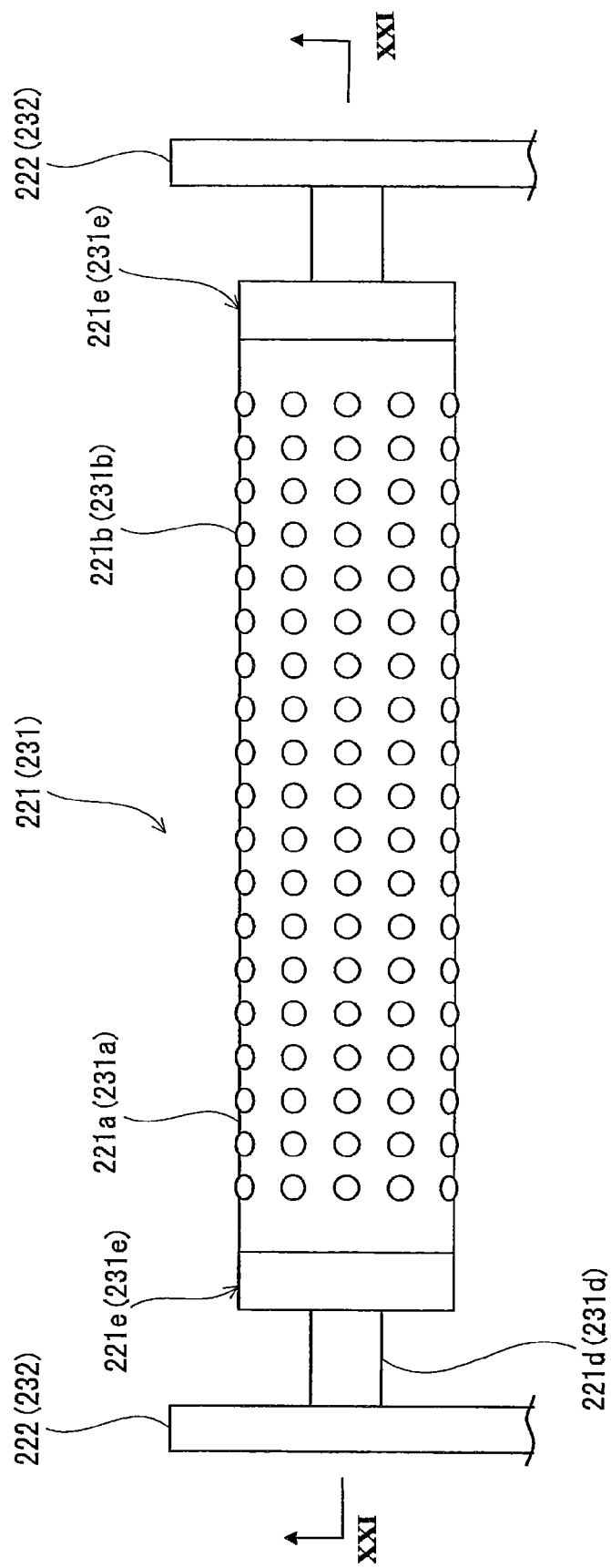
FIG. 20 is an overall front view of the guide member according to the one embodiment.
Figure 21:
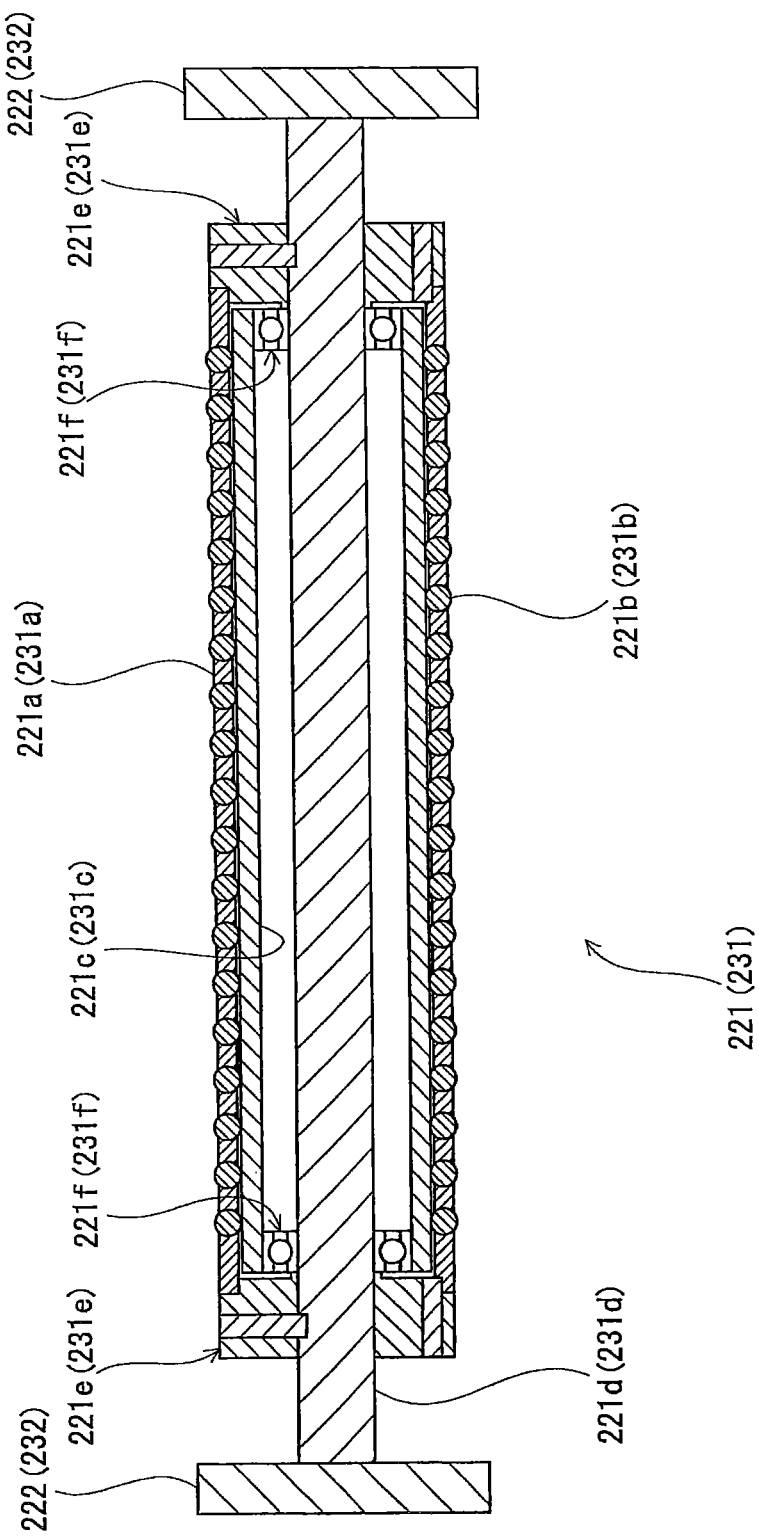
FIG. 21 is a sectional view, taken along the line XXI-XXI of FIG. 20, of the guide member according to the one embodiment.

As shown in FIG. 19 to FIG. 21, the spiral guide member 221 (231) includes a cylindrical guide body 221a (231a) that forms its outer circumference. The spiral guide member 221 (231) includes a plurality of rolling members 221b (231b) that are rollably accommodated in the guide body 221a (231a), and a cylindrical support member 221c (231c) that is arranged inside the guide body 221a (231a) and supports the rolling members 221b (231b) from the inside in the radial direction.

Further, the spiral guide member 221 (231) includes a shaft 221d (231d) having end portions respectively secured to base members 222 (232) that are secured to the vacuum chamber 5. Furthermore, the spiral guide member 221 (231) includes securing members 221e (231e) that secure the guide body 36 to the shaft 221d (231d) in order to prevent the rotation of the guide body 221a (231a) when the substrate 81 is being conveyed. The spiral guide member 221 (231) includes bearing members 221f (2310 rotatably bearing the support member 221c (231c).

The rolling members 221b (231b) are each arranged so as to partially project from the guide body 221a (231a) outwardly in the radial direction of the guide body 221a (231a). The rolling members 221b (231b) are each arranged so as to partially project from the guide body 221a (231a) inwardly in the radial direction of the guide body 221a (231a). Accordingly, the spiral guide member 221 (231) is formed so as to have an outer circumferential surface in the form of projections and recesses.

The plurality of rolling members 221b (231b) are arranged so that their portions projecting outwardly in the radial direction from the guide body 221a (231a) are each in contact with the substrate 81. Thus, the substrate 81 extends over the plurality of rolling members 221b (231b) in contact therewith. In other words, the substrate 81 is hung over the outer circumference of the spiral guide member 221 (231) so as to be in contact with the plurality of rolling members 221b (231b) but spaced from the guide body 221a (231a).

Further, the rolling member 221b (231b) are provided so that their portions projecting from the guide body 221a (231a) inwardly in the radial direction are each in contact with the outer circumference of the support member 221c (231c). In this embodiment, the rolling members 221b (231b) are each a spherical body that can rotate with three degrees of freedom.

The support member 221c (231c) supports the rolling members 221b (231b) on its outer circumference. This can prevent the substrate 81 from separating from the guide body 221a (231a) or deviating inwardly in the radial direction of the guide body 221a (231a), even though the rolling members 221b (231b) are subjected to a force applied inwardly in the radial direction of the guide body 221a (231a) from the substrate 81 that is in contact with the rolling members 221b (231b).

Further, the bearing members 221f (231f) allow the rotation of the support member 221c (231c) about the axis direction (shaft 221d (231d)). Accordingly, the support member 221c (231c) is rotated by the friction with the rolling members 221b (231b) that roll as the substrate 81 is conveyed, which can stabilize the rotational speed of the rolling members 221b (231b) (to a substantially uniform rotational speed).

Returning to FIG. 1, the first direction changing unit 24 includes a guide member (which hereinafter may be referred to as a "horizontal guide member") 241 arranged along the horizontal direction. Further, the first direction changing unit 24 includes a guide member (which hereinafter may be referred to as an "inclined guide member") 242 arranged on the downstream side of the horizontal guide member along a direction inclined to the horizontal direction and the vertical direction.

In the first direction changing unit 24, the substrate 81 is hung over the pair of guide members 241 and 242. The substrate 81 is in contact with (hung over) the outer circumference of the horizontal guide member 241 by about a quarter turn along the circumferential direction, and is in contact with (hung over) the outer circumference of the inclined guide portion 242 by about a half turn along the spiral direction.

The first direction changing unit 24 is configured to turn the substrate 81 conveyed from the first spiral conveyance unit 22 so as to change the facing direction of the deposition surface 81a from downward to lateral, while supporting the substrate 81 from a non-deposition surface 81b side so that the non-deposition surface 81b faces the inside of the turn, so as to guide the substrate 81 to the can roller 26.

Specifically, the substrate 81 is first bent around the horizontal guide member 241 serving as a support axis so as to be conveyed from a lateral side upward to the inclined guide member 242. Thereafter, the substrate 81 is bent around the inclined guide member 242 serving as a support axis so as to be conveyed from an upper side laterally to the can roller 26.

The horizontal guide member 241 is arranged in the horizontal direction along the width direction (direction perpendicular to the longitudinal direction) of the substrate 81. The horizontal guide member 241 is a roller member that is formed into a cylindrical shape and is rotatable about the axis direction. The horizontal guide member 241 as a whole rotates as the substrate 81 is conveyed. Further, the horizontal guide member 241 is formed so as to have a smooth outer circumferential surface.

The inclined guide member 242 is arranged above the horizontal guide member 241. The inclined guide member 242 is inclined upward at an angle (45° in this embodiment) to the horizontal direction. The inclined guide member 242 is inclined at an angle (45° in this embodiment) to the width direction of the substrate 81.

The inclined guide member 242 includes a plurality of rolling members (not shown or numbered) rollably arranged over the outer circumference so that the substrate 81 is in contact therewith, in order to prevent the substrate 81 from deviating as the substrate 81 is conveyed. That is, the inclined guide member 242 has the same configuration as the spiral guide member 221 (231).

The second direction changing unit 25 includes a guide member (which hereinafter may be referred to as an "inclined guide member") 251 arranged along a direction inclined to the horizontal direction and the vertical direction. Further, the second direction changing unit 25 includes a guide member (which hereinafter may be referred to as a "horizontal guide member") 252 arranged on the downstream side of the inclined guide member 251 along the horizontal direction.

In the second direction changing unit 25, the substrate 81 is hung over the pair of guide members 251 and 252. The substrate 81 is in contact with (hung over) the outer circumference of the inclined guide member 251 by about a half turn along the spiral direction. The substrate 81 is in contact with (hung over) the outer circumference of the horizontal guide member 252 by about a quarter turn along the circumferential direction.

The second direction changing unit 25 is configured to turn the substrate 81 conveyed from the can roller 26 so as to change the facing direction of the deposition surface 81a from lateral to downward, while supporting the substrate 81 from the non-deposition surface 81b side so that the non-deposition surface 81b faces the inside of the turn, so as to guide the substrate 81 to the second spiral conveyance unit 23.

Specifically, the substrate 81 is first bent around the inclined guide member 251 serving as a support axis so as to be conveyed from a lateral side downward to the horizontal guide member 252. Thereafter, the substrate 81 is bent around the horizontal guide member 252 serving as a support axis so as to be conveyed from a lower side laterally to the second spiral conveyance unit 23.

The inclined guide member 251 is inclined upward at an angle (45° in this embodiment) to the horizontal direction. The inclined guide member 251 is inclined at an angle (45° in this embodiment) to the width direction of the substrate 81. The inclined guide member 251 has a configuration including a plurality of rolling members (not shown or numbered) rollably arranged over its outer circumference so that the substrate 81 is in contact therewith, in order to prevent the substrate 81 from deviating as the substrate 81 is conveyed. That is, the inclined guide member 251 has the same configuration as the spiral guide member 221 (231).

The horizontal guide member 252 is arranged below the inclined guide member 251. The horizontal guide member 252 is arranged in the horizontal direction along the width direction of the substrate 81 (direction perpendicular to the longitudinal direction). The horizontal guide member 252 is a roller member that is formed into a columnar shape and is rotatable about the axis direction. The horizontal guide member 252 as a whole rotates as the substrate 81 is conveyed. The horizontal guide member 252 is formed so as to have a smooth outer circumferential surface.

The heating mechanism 3 includes a heat source 31 that emits heat toward the outer circumference of the first spiral guide member 221 in order to heat the substrate 81. The heat source 31 is arranged below the spiral guide member 221 along the axis direction of the spiral guide member 221. Specifically, the heat source 31 is arranged at a position such that the distance from the substrate 81 is not more than 300 mm. In this embodiment, a halogen heater is used as the heat source 31.

The deposition mechanism 4 includes a first deposition unit 41 that is an upward deposition unit arranged between the first spiral conveyance unit 22 and the first direction changing unit 24, and a second deposition unit 42 that is a lateral deposition unit arranged laterally of the can roller 26. Further, the deposition mechanism 4 includes a third deposition unit 43 that is an upward deposition unit arranged between the second direction changing unit 25 and the second spiral conveyance unit 23, and a fourth deposition unit 44 that is an upward deposition unit arranged below the second spiral conveyance unit 23.

The first deposition unit 41 includes an anode layer-evaporation source 41a that forms an anode layer over the deposition surface 81a of the substrate 81 by discharging a vaporized material through evaporation. The first deposition unit 41 includes an edge cover-evaporation source 41b that is arranged downstream of the anode layer-evaporation source 41a and forms an edge cover for covering the peripheral edges of the anode layer by discharging a vaporized material through evaporation.

Further, the first deposition unit 41 has the evaporation sources 41a and 41b arranged below the substrate 81 that is being conveyed. The first deposition unit 41 constitutes an upward deposition unit that performs deposition over the substrate 81 that is being conveyed, with the deposition surface 81a facing downward, by discharging the vaporized materials from the evaporation sources 41a and 41b toward the deposition surface 81a.

The evaporation sources 41a and 41b are each arranged facing the deposition surface 81a of the substrate 81 and having an opening arranged at an upper portion in order to discharge a vaporized material upward. Further, the evaporation sources 41a and 41b are each arranged at a position close to the substrate 81. Specifically, the evaporation sources 41a and 41b are each arranged at a position such that the distance (shortest distance) between the substrate 81 and its opening end (nozzle) is not more than 10 mm.

Further, the second deposition unit 42 has evaporation sources 42a to 42e arranged laterally of the substrate 81 that is being conveyed. The second deposition unit 42 constitutes a lateral deposition unit that performs deposition over the substrate 81 that is being conveyed, with the deposition surface 81a facing laterally, by discharging the vaporized materials from the evaporation sources 42a to 42e toward the deposition surface 81a.

The evaporation sources 42a to 42e are each arranged facing the deposition surface 81a of the substrate 81 and having an opening arranged at a lateral portion in order to discharge a vaporized material laterally. Further, the evaporation sources 42a to 42e are each arranged at a position close to the substrate 81. Specifically, the evaporation sources 42a to 42e are each arranged at a position such that the distance (shortest distance) between the substrate 81 and its opening end (nozzle) is not more than 10 mm.

The third deposition unit 43 includes three cathode layer-evaporation sources 43a, 43b, and 43c in order to form cathode layers over the deposition surface 81a of the substrate 81 by discharging vaporized materials through evaporation. Further, the third deposition unit 43 has the evaporation sources 43a to 43c arranged below the substrate 81 that is being conveyed. The third deposition unit 43 constitutes an upward deposition unit that performs deposition over the substrate 81 that is being conveyed, with the deposition surface 81a facing downward, by discharging the vaporized materials from the evaporation sources 43a to 43c toward the deposition surface 81a.

The evaporation sources 43a to 43c are each arranged facing the deposition surface 81a of the substrate 81 and having an opening arranged at an upper portion in order to discharge a vaporized material upward. Further, the evaporation sources 43a to 43c are each arranged at a position close to the substrate 81. Specifically, the evaporation sources 43a to 43c are each arranged at a position such that the distance (shortest distance) between the substrate 81 and its opening end (nozzle) is not more than 10 mm.

The fourth deposition unit 44 includes a sealing layer-evaporation source 44a that forms a sealing layer for preventing the contact of each layer with the air over the deposition surface 81a of the substrate 81 by discharging a vaporized material through evaporation. Further, the fourth deposition unit 44 is arranged below the second spiral guide member 231 along the axis direction of the second spiral guide member 231.

The fourth deposition unit 44 constitutes an upward deposition unit that performs deposition over a portion of the substrate 81 passing on the lower side of the second spiral guide member 231, that is, a portion of the substrate 81 with the deposition surface 81a facing downward, by discharging the vaporized material from the evaporation source 44a toward the deposition surface 81a. In this way, the substrate 81 passes on the lower side of the second spiral guide member 231 three times, and therefore the vaporized material can be deposited over the substrate 81 three times by the evaporation source 44a discharging the vaporized material toward the outer circumference on the lower side of the second spiral guide member 231.

The evaporation source 44a is arranged facing the deposition surface 81a of the substrate 81 and having an opening arranged at an upper portion in order to discharge the vaporized material upward. Further, the evaporation source 44a is arranged at a position close to the substrate 81. Specifically, the evaporation source 44a is arranged at a position such that the distance (shortest distance) between the substrate 81 and its opening end (nozzle) is not more than 10 mm.

The evaporation sources 41a to 41b, 42a to 42e, 43a to 43c, and 44a of the deposition units 41 to 44 are each configured to vaporize a material accommodated thereinside by heating with a heating unit (not shown or numbered), and then discharge the vaporized material through its opening toward the deposition surface 81a of the substrate 81.

The vacuum chamber 5 includes a plurality of vacuum chambers (not shown or numbered). The respective vacuum chambers accommodate the substrate feeding unit 21, the first spiral conveyance unit 22 and the heating mechanism 3, the first deposition unit 41, the first direction changing unit 24, the can roller 26 and the second deposition unit 42, the second direction changing unit 25, the third deposition unit 43, the second spiral conveyance unit 23 and the fourth deposition unit 44, and the substrate take-up unit 27.

Further, the pressure inside each vacuum chamber is reduced by a vacuum generating mechanism (not shown or numbered) so that the inside thereof is under vacuum. Further, adjacent vacuum chambers are in communication with one another via a communication unit for sequentially conveying the substrate 81 through the vacuum chambers, and are configured so that the vacuum state thereinside is maintained.

Next, a method for manufacturing an organic EL device 8 using the manufacturing apparatus 1 according to this embodiment is described.

The substrate 81 wound into a roll is unwound from the substrate feeding unit 21 (substrate feeding step). The substrate 81 unwound from the substrate feeding unit 21 is conveyed to the first spiral conveyance unit 22, where the substrate 81 is wound around the outer circumference of the first spiral guide member 221 along the spiral direction with two turns (first spiral conveyance step).

In the first spiral conveyance step, the heat source 31 of the heating mechanism 3 arranged below the first spiral guide member emits heat toward the outer circumference of the spiral guide member 221. This heats the substrate 81 to a predetermined temperature (for example, 200 to 300° C.) (substrate heating step).

Specifically, the substrate 81 is heated by not only the heat that is emitted from the heat source 31 and directly transferred to the substrate 81 during the time when the substrate 81 passes on the lower side of the first spiral guide member 221 three times, but also the heat that is emitted from the heat source 31 and indirectly transferred to the substrate 81 via the first spiral guide member 221 (for example, made of metal) that has thermal conductivity during the time when the substrate 81 is in contact with the outer circumference of the first spiral guide member 221 (making two turns).

The thus heated substrate 81 is conveyed to the first deposition unit 41 with the deposition surface 81a facing downward. Then, the anode layer-evaporation source 41a discharges the vaporized material upward, thereby forming an anode layer on the lower surface (deposition surface 81a) of the substrate 81 that is being conveyed. Thereafter, the edge cover evaporation source 41b discharges the vaporized material upward, thereby forming an edge cover so as to cover the peripheral edges of the anode layer (first deposition step).

The substrate 81 that has been subjected to deposition in the first deposition unit 41 is conveyed to the first direction changing unit 24. In the first direction changing unit 24, the substrate 81 is guided by the guide members 241 and 242 to the can roller 26 so as to be turned so that the facing direction of the deposition surface 81a is changed from downward to lateral (first direction changing step). At this time, the substrate 81 is supported by the guide members 241 and 242 from the non-deposition surface 81b side so that the non-deposition surface 81b faces the inside of the turn.

The substrate 81 conveyed to the can roller 26 is wound and hung around the outer circumference of the can roller 26, so as to be supported and guided by the can roller 26 (can roller conveyance step). In the can roller conveyance step, the respective evaporation sources 42a to 42e arranged laterally of the substrate 81 discharge the vaporized materials toward a lateral side, thereby forming an organic EL layer composed of five organic EL layer-constituent layers (a hole injection layer, a hole transporting layer, a light emitting layer, an electron transporting layer, and an electron injection layer) (second deposition step).

The substrate 81 that has been subjected to deposition in the second deposition unit 42 is conveyed to the second direction changing unit 25. In the second direction changing unit 25, the substrate 81 is guided by the guide members 251 and 252 to the third deposition unit 43 so as to be turned so that the facing direction of the deposition surface 81a is changed from laterally to downward (second direction changing step). At this time, the substrate 81 is supported by the guide members 251 and 252 from the non-deposition surface 81b side so that the non-deposition surface 81b faces the inside of the turn.

The substrate 81 whose direction has been changed is conveyed to the third deposition unit 43 with the deposition surface 81a facing downward. In the third deposition unit 43, the cathode layer-evaporation sources 43a to 43c discharge the vaporized materials upward, thereby forming a cathode layer composed of three cathode layer-constituent layers (a LiF layer, a Mg layer, and an Ag layer) on the lower surface (deposition surface 81a) of the substrate 81 that is being conveyed.

The substrate 81 that has been subjected to deposition in the third deposition unit 43 is conveyed to the second spiral conveyance unit 23. The substrate 81 is conveyed to the second spiral conveyance unit 23, where the substrate 81 is wound around the outer circumference along the spiral direction of the second spiral guide member 231 with two turns (second spiral conveyance step).

In the second spiral conveyance step, the sealing layer-evaporation source 44a of the fourth deposition unit 44 arranged below the second spiral guide member 231 discharges the vaporized material toward the lower side of the outer circumference of the second spiral guide member 231, thereby forming a sealing layer (fourth deposition step). Specifically, during the time when the substrate 81 passes on the lower side of the second spiral guide member 231 three times, the vaporized material discharged from the sealing layer-evaporation source 44a is deposited over the substrate 81 three times.

In this way, an organic EL device 80 having an anode layer, an organic EL layer, and a cathode layer is formed over the substrate 81. Then, the substrate 81 over which the organic EL device 80 has been formed is wound into a roll by the substrate take-up unit 27 (substrate take-up step).

The substrate 81 is conveyed while being supported and guided by being hung over the outer circumferences of the plurality of guide members 221, 231, 241, 242, 251, 252, and 26 (conveyance step). That is, in this embodiment, the conveyance step is composed of the first spiral conveyance step, the first direction changing step, the can roller conveyance step, the second direction changing step, and the second spiral conveyance step.

As described above, according to the organic EL device-manufacturing apparatus 1 and the organic EL device-manufacturing method of this embodiment, the substrate 81 is hung over the outer circumferences of the plurality of guide members 221, 231, 241, 242, 251, 252, and 26, and therefore the substrate 81 is supported and guided by the guide members 221, 231, 241, 242, 251, 252, 26 in the conveyance step. In this way, the substrate 81 is conveyed.

In the respective spiral conveyance steps in the conveyance step, the substrate 81 is conveyed by being wound around the outer circumferences of the spiral guide members 221 and 231 along the spiral direction with at least one turn (specifically, two turns). In this way, the substrate 81 is conveyed while passing on the lower side of each of the spiral guide members 221 and 231 multiple times (specifically, three times). Accordingly, flexible design that has not been realized so far is made possible.

Further, according to the organic EL device-manufacturing apparatus 1 and the organic EL device-manufacturing method of this embodiment, the substrate 81 is conveyed while passing on the lower side of the second spiral guide member 231 (specifically, three times) in the second spiral conveyance step. Accordingly, in the second spiral conveyance step, the vaporized material is deposited over the substrate 81 multiple times (specifically, three times) by the sealing layer-evaporation source 44a discharging the vaporized material toward the lower side of the outer circumference of the second spiral guide member 231.

Further, it is also possible to increase the conveying speed of the substrate 81, which can improve the productivity. Specifically, the conveying speed of the substrate 81 has needed to be set to the processing speed of the fourth deposition step (sealing layer-forming step) that is lowest. In contrast, according to the manufacturing apparatus 1 and the manufacturing method of this embodiment, the fourth deposition step is performed in the second spiral conveyance step, thereby increasing the conveying speed of the substrate 81 as compared to conventional technique.

Further, according to the organic EL device-manufacturing apparatus and the organic EL device-manufacturing method of this embodiment, the substrate 81 is conveyed while passing on the lower side of the first spiral guide member 221 multiple times (specifically, three times) in the first spiral conveyance step. Accordingly, the substrate 81 is heated multiple times (specifically, three times) by the heat source 31 emitting heat toward the lower side of the outer circumference of the first spiral guide member 221 in the first spiral conveyance step.

This makes it possible to increase the number of times for direct heating as compared to a common roller member (which is in contact with the substrate with less than a half turn) since the emitted heat is directly transferred to the substrate 81, every time when the substrate 81 passes on the lower side of the first spiral guide member 221. Accordingly, it is possible to heat the substrate 81 efficiently.

Furthermore, the emitted heat is transferred also indirectly to the substrate 81 via the first spiral guide member 221 during the time when the substrate 81 is in contact with the first spiral guide member 221. This can increase the time during which the substrate 81 is in contact with the first spiral guide member 221, thereby increasing the duration for indirect heating, as compared to a common roller member (which is in contact with the substrate with less than a half turn). Accordingly, it is possible to heat the substrate 81 further efficiently.

Further, according to the organic EL device-manufacturing apparatus 1 and the organic EL device-manufacturing method of this embodiment, the plurality of rolling members 221b and 231b are arranged over the outer circumferences of the spiral guide members 221 and 231, and the substrate 81 that is being conveyed extends over the plurality of rolling members 221b and 231b in contact therewith. Accordingly, it is possible to reduce the area where the spiral guide members 221 and 231 are each in contact with the substrate 81, as compared to a common roller member having a smooth outer circumferential surface, thereby suppressing the friction between the substrate 81 and each of the spiral guide members 221 and 231.

In addition, since the rolling members 221b and 231b are rollable, the rolling members 221b and 231b can roll as the substrate 81 is conveyed. Accordingly, it is possible to suppress the friction between the substrate 81 and each of the spiral guide members 221 and 231 more effectively, thereby suppressing the positional deviation (meandering movement) of the substrate 81 relative to each of the spiral guide members 221 and 231.

Further, according to the organic EL device-manufacturing apparatus 1 and the manufacturing method of this embodiment, since the rolling members 221b and 231b are each a spherical body that can rotate with three degrees of freedom, the rolling members 221b and 231b can rotate in any direction. Accordingly, when the substrate 81 is hung over the outer circumferences of the spiral guide members 221 and 231 along the spiral direction, the rolling members 221b and 231b each rotate in the direction in which the substrate 81 is conveyed. This can effectively suppress the positional deviation of the substrate 81 relative to each of the spiral guide members 221 and 231.

The guide member 221 (231) according to the embodiments described herein has a configuration in which the guide body 221a (231a) is secured to the shaft 221d (231d) so as not to rotate relative to the shaft 221d (231d) even when the substrate 81 is conveyed, which is not restrictive. For example, the guide body 221a (231a) may be configured to rotate relative to the shaft 221d (231d), so as to rotate relative to the shaft 221d (231d) as the substrate 81 is conveyed.

REFERENCE SIGNS LIST

1: Organic EL Device-Manufacturing Apparatus
3: Vacuum Chamber
9a to 9l: Evaporation Source
19: Organic EL Device
21: Substrate
21a: Deposition Surface
21b: Non-Deposition Surface
23: Anode Layer
25: Organic EL Layer
27: Cathode Layer
30a, 30b: Direction Changing Unit
31a, 31b: Guide Mechanism
33a to 33d: Roller Member

The invention claimed is:

1. A method for manufacturing an organic EL device, in which constituent layers of an organic EL element are formed over a substrate in the form of a strip by deposition, while the substrate is being moved in the longitudinal direction, the method comprising:

a constituent layer-forming step of performing deposition over one surface of the substrate, while the substrate is being moved in the longitudinal direction, sequentially in at least an upward deposition unit and a lateral deposition unit arranged along the moving direction of the substrate by discharging a vaporized material from an evaporation source, the constituent layer-forming step comprising:

an upward deposition step of performing deposition over a deposition surface of the substrate, while the substrate is being moved with its deposition surface facing downward, in the upward deposition unit by discharging the vaporized material from the evaporation source arranged below the substrate toward the deposition surface;

a lateral deposition step of performing deposition over a deposition surface of the substrate, while the substrate is being moved with its deposition surface facing laterally, in the lateral deposition unit by discharging the vaporized material from the evaporation source arranged laterally of the substrate toward the deposition surface; and a direction changing step of turning the substrate conveyed from the upward deposition unit so as to change the facing direction of the deposition surface from downward to lateral, by means of a guide mechanism provided between the upward deposition unit and the lateral deposition unit, while supporting the substrate from the non-deposition surface side so that the non-deposition surface of the substrate faces the inside of the turn, so as to guide the substrate to the lateral deposition unit.

2. A method for manufacturing an organic EL device, in which constituent layers of an organic EL element are formed over a substrate in the form of a strip by deposition, while the substrate is being moved in the longitudinal direction, the method comprising:

a constituent layer-forming step of performing deposition over one surface of the substrate, while the substrate is being moved in the longitudinal direction, sequentially in at least a lateral deposition unit and an upward deposition unit arranged along the moving direction of the substrate by discharging a vaporized material from an evaporation source, the constituent layer-forming step comprising:

a lateral deposition step of performing deposition over a deposition surface of the substrate, while the substrate is being moved with its deposition surface facing laterally, in the lateral deposition unit by discharging the vaporized material from the evaporation source arranged laterally of the substrate toward the deposition surface;

an upward deposition step of performing deposition over a deposition surface of the substrate, while the substrate is being moved with its deposition surface facing downward, in the upward deposition unit by discharging the vaporized material from the evaporation source arranged below the substrate toward the deposition surface; and a direction changing step of turning the substrate conveyed from the lateral deposition unit so as to change the facing direction of the deposition surface from lateral to downward, by means of a guide mechanism provided between the lateral deposition unit and the upward deposition unit, while supporting the substrate from the non-deposition surface side so that the non-deposition surface of the substrate faces the inside of the turn, so as to guide the substrate to the upward deposition unit.

3. The method for manufacturing an organic EL device according to claim 1, wherein the guide mechanism has a plurality of roller members supporting the non-deposition surface, and at least one of the roller members is arranged along a direction inclined to a width direction of the substrate.

4. The method for manufacturing an organic EL device according to claim 3, wherein the at least one of the roller members is arranged along a direction inclined at 45° to the width direction.

5. An apparatus for manufacturing an organic EL device, in which constituent layers of an organic EL element are formed over a substrate in the form of a strip by deposition, while the substrate is being moved in the longitudinal direction, the apparatus comprising:

an upward deposition unit including an evaporation source arranged below the substrate that is being moved, the upward deposition unit being configured to perform deposition over a deposition surface of the substrate, while the substrate is being moved with its deposition surface facing downward, by discharging a vaporized material from the evaporation source toward the deposition surface;

a lateral deposition unit including an evaporation source arranged laterally of the substrate that is being moved, the lateral deposition unit being configured to perform deposition over the deposition surface of the substrate, while the substrate is being moved with its deposition surface facing laterally, by discharging a vaporized material from the evaporation source toward the deposition surface; and a direction changing unit including a guide mechanism provided between the upward deposition unit and the lateral deposition unit, the guide mechanism being configured to turn the substrate conveyed from the upward deposition unit so as to change the facing direction of the deposition surface from downward to lateral, while supporting the substrate from a non-deposition surface side so that the non-deposition surface of the substrate faces the inside of the turn, so as to guide the substrate to the lateral deposition unit.

6. An apparatus for manufacturing an organic EL device, in which constituent layers of an organic EL element are formed over a substrate in the form of a strip by deposition, while the substrate is being moved in the longitudinal direction, the apparatus comprising:

a lateral deposition unit including an evaporation source arranged laterally of the substrate that is being moved, the lateral deposition unit being configured to perform deposition over a deposition surface of the substrate, while the substrate is being moved with its deposition surface facing laterally, by discharging a vaporized material from the evaporation source toward the deposition surface;

an upward deposition unit including an evaporation source arranged below the substrate that is being moved, the upward deposition unit being configured to perform deposition over the deposition surface of the substrate, while the substrate is being moved with its deposition surface facing downward, by discharging a vaporized material from the evaporation source toward the deposition surface; and a direction changing unit including a guide mechanism provided between the lateral deposition unit and the upward deposition unit, the guide mechanism being configured to turn the substrate conveyed from the lateral deposition unit so as to change the facing direction of the deposition surface from lateral to downward, while supporting the substrate from a non-deposition surface side so that the non-deposition surface of the substrate faces the inside of the turn, so as to guide the substrate to the upward deposition unit.

7. The method for manufacturing an organic EL device according to claim 2, wherein the guide mechanism has a plurality of roller members supporting the non-deposition surface, and at least one of the roller members is arranged along a direction inclined to a width direction of the substrate.

8. The method for manufacturing an organic EL device according to claim 7, wherein the at least one of the roller members is arranged along a direction inclined at 45° to the width direction.

* * * * *